United States Patent
Kim et al.

(10) Patent No.: US 10,943,961 B2
(45) Date of Patent: Mar. 9, 2021

(54) DISPLAY DEVICE HAVING A REINFORCING LAYER

(71) Applicant: SAMSUNG DISPLAY CO., LTD., Yongin-si (KR)

(72) Inventors: Yeontae Kim, Yongin-si (KR); Chung Yi, Seongnam-si (KR); Youngsoo No, Seoul (KR); Wongu Cho, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/414,942

(22) Filed: May 17, 2019

(65) Prior Publication Data
US 2020/0020754 A1 Jan. 16, 2020

(30) Foreign Application Priority Data

Jul. 12, 2018 (KR) .................. 10-2018-0080950

(51) Int. Cl.
*H01L 27/32* (2006.01)
*H01L 51/00* (2006.01)
*H01L 51/52* (2006.01)

(52) U.S. Cl.
CPC ...... *H01L 27/3244* (2013.01); *H01L 51/0097* (2013.01); *H01L 51/5253* (2013.01)

(58) Field of Classification Search
CPC ............. H01L 27/3244; H01L 51/0097; H01L 51/5253
USPC ....................................................... 257/72
See application file for complete search history.

(56) References Cited

U.S. PATENT DOCUMENTS

| 6,061,246 A * | 5/2000 | Oh ................ G02F 1/13452 361/749 |
|---|---|---|
| 9,583,448 B2 | 2/2017 | Ahn |
| 9,887,386 B2 | 2/2018 | Park et al. |
| 2002/0027634 A1 | 3/2002 | Kang et al. |

(Continued)

FOREIGN PATENT DOCUMENTS

| EP | 2793536 | 10/2014 |
|---|---|---|
| KR | 1020140086639 | 7/2014 |

(Continued)

OTHER PUBLICATIONS

Extended European Search Report dated Nov. 20, 2019 for European Application No. 19169772.1-1211.

*Primary Examiner* — Tong-Ho Kim
(74) *Attorney, Agent, or Firm* — F. Chau & Associates, LLC

(57) ABSTRACT

A display device includes a substrate having a first side and a second side opposite to the first side. A plurality of pixels is disposed on the substrate. A flexible circuit board is connected to the first side of the substrate. A driving integrated circuit is disposed on a lower portion of the flexible circuit board. A coating layer is disposed on the lower portion of the flexible circuit board. The coating layer is spaced apart from the first side of the substrate and at least partially surrounds the driving integrated circuit. A reinforcing layer is disposed between the first side of the substrate and the coating layer on the lower portion of the flexible circuit board. The reinforcing layer covers a side of the coating layer that faces the first side of the substrate.

31 Claims, 15 Drawing Sheets

(56) References Cited

U.S. PATENT DOCUMENTS

| | | | | |
|---|---|---|---|---|
| 2013/0293816 A1* | 11/2013 | Jung | ................... | H01L 27/3288 |
| | | | | 349/139 |
| 2014/0306348 A1* | 10/2014 | Ahn | ..................... | H05K 1/0281 |
| | | | | 257/773 |
| 2016/0014417 A1 | 1/2016 | Benkual et al. | | |
| 2016/0219695 A1 | 7/2016 | Choi | | |
| 2017/0123461 A1 | 5/2017 | Kim et al. | | |
| 2017/0336907 A1* | 11/2017 | Jeong | ................... | G06F 3/0416 |
| 2018/0011576 A1 | 1/2018 | Ryu | | |
| 2018/0090702 A1 | 3/2018 | Um et al. | | |

FOREIGN PATENT DOCUMENTS

| | | |
|---|---|---|
| KR | 1020150069308 | 6/2015 |
| KR | 1020160095312 | 8/2016 |
| KR | 10-1669317 | 10/2016 |
| KR | 1020170051854 | 5/2017 |
| KR | 1020160006533 | 1/2018 |
| KR | 1020180035962 | 4/2018 |

* cited by examiner

DISPLAY DEVICE HAVING A REINFORCING LAYER

CROSS-REFERENCE TO RELATED APPLICATIONS

This U.S. non-provisional patent application claims priority under 35 U.S.C. § 119 to Korean Patent Application No. 10-2018-0080950, filed on Jul. 12, 2018, the entire contents of which are hereby incorporated by reference.

TECHNICAL FIELD

The present disclosure herein relates to a display device, and more particularly, to a display device having a reinforcing layer.

DISCUSSION OF THE RELATED ART

In general, a display device includes a display panel on which a plurality of pixels are disposed and a driving integrated circuit (IC) connected to one side of the display panel to drive the pixels. The driving integrated circuit generates driving signals and provides the generated driving signals to the pixels. The pixels are driven in response to the driving signals to generate a predetermined image.

The driving integrated circuit is mounted on a flexible printed circuit board (FPCB), and one side of the flexible printed circuit board is connected to one side of the display panel. The driving integrate circuit is connected to the pixels of the display panel through the flexible printed circuit board. The above-described connection method may be referred to as a chip on film (COF) method.

As the flexible printed circuit board is bent so as to position the driving integrated circuit on a lower portion of the display panel. The bent portion of the flexible printed circuit board may be referred to as a bending part. No image is displayed on the bending part and so, the bending part may be regarded as dead space.

To reduce the dead space, the bending part may be shortened. However, in shortening the bending part, more stress may be placed thereon and so cracks may form on conductive lines disposed on the bending part.

SUMMARY

A display device includes a substrate having a first side and a second side opposite to the first side. A plurality of pixels is disposed on the substrate. A flexible circuit board is connected to the first side of the substrate. A driving integrated circuit is disposed on a lower portion of the flexible circuit board. A coating layer is disposed on the lower portion of the flexible circuit board. The coating layer is spaced apart from the first side of the substrate and at least partially surrounds the driving integrated circuit. A reinforcing layer is disposed between the first side of the substrate and the coating layer on the lower portion of the flexible circuit board. The reinforcing layer covers a side of the coating layer that faces the first side of the substrate.

A display device includes a substrate. A plurality of pixels is disposed on the substrate. A flexible circuit board is connected to the substrate. A driving integrated circuit is disposed on the flexible circuit board. A coating layer is disposed on the flexible circuit board and is spaced apart from the substrate. The coating layer at least partially surrounds the driving integrated circuit. A reinforcing layer is disposed on the flexible circuit board. The reinforcing layer extends from the substrate to a predetermined portion of the coating layer.

A display device includes a substrate. A plurality of pixels is disposed on the substrate. A flexible circuit board is connected to the substrate. A driving integrated circuit is disposed on the flexible circuit board. A coating layer is disposed on the flexible circuit board, is spaced apart from the substrate, and at least partially surrounds the driving integrated circuit. A reinforcing layer is disposed on the flexible circuit board between the substrate and the coating layer. The reinforcing layer is disposed on a predetermined portion of the substrate, which is adjacent to an upper end of the substrate, and is not disposed on a lower portion of the coating layer.

BRIEF DESCRIPTION OF THE FIGURES

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
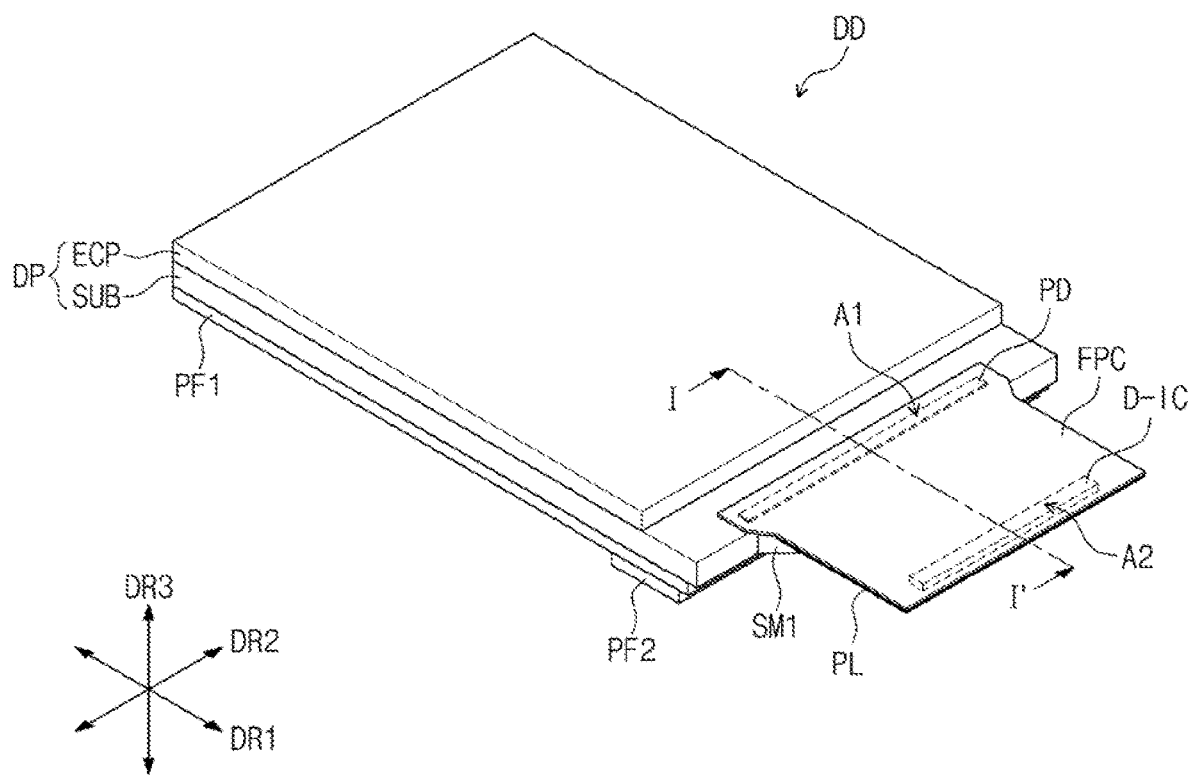
FIG. 1 is a perspective view illustrating a display device according to an exemplary embodiment of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals may refer to like elements throughout the specification and the drawings. Also, in the figures, the thickness, ratio, and dimensions of components may be exaggerated for clarity of illustration.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the present disclosure. The terms of a singular form may include plural forms unless referred to the contrary.

Hereinafter, exemplary embodiments of the present disclosure will be described in detail with reference to the accompanying drawings.

FIG. 1 is a perspective view illustrating a display device according to an exemplary embodiment of the present inventive concept.

Referring to FIG. 1, a display device DD may include a display panel DP, a flexible circuit board FPC (or flexible printed circuit board) connected to the display panel DP, a driving integrated circuit D-IC disposed on a lower portion of the flexible circuit board FPC, a first protection film PF1 disposed on a lower portion of the display panel DP, and a second protection film PF2 disposed on a lower portion of the first protection film PF1.

The display panel DP may have a rectangular shape having long sides extended in a first direction DR1 and short sides extended in a second direction DR2. The second direction DR2 crosses the first direction DR1, for example, at a right angle. However, the present invention is not limited to the shape of the display panel DP. Hereinafter, a direction crossing a plane defined by the first direction DR1 and the second direction DR2 in a substantially perpendicular manner is a third direction DR3.

The display panel DP may be an organic light emitting diode (OLED) display panel including a plurality of organic light emitting elements. However, the present invention is not limited thereto. For example, various display panels such as a liquid crystal display panel, an electrowetting display panel, and an electrophoretic display panel may be used as the display panel DP.

The display panel DP may include a substrate SUB and an encapsulation layer ECP disposed on the substrate SUB. Each of the substrate SUB and the encapsulation layer ECP may have a rectangular shape having long sides extended in the first direction DR1 and short sides extended in the second direction DR2.

The substrate SUB may be a transparent substrate containing a glass or a plastic material. When the substrate SUB contains a plastic material, the display panel DP may be a flexible display panel. For example, the substrate SUB may contain a plastic material such as polyimide (PI).

The encapsulation layer ECP may include a thin-film encapsulation layer. However, the present invention is not limited thereto. For example, the encapsulation layer ECP may include an encapsulation substrate. Examples of the thin-film encapsulation layer and the encapsulation substrate will be described below in detail. The display panel DP may include a plurality of pixels disposed on the substrate SUB, and, hereinafter, a configuration of the pixels will be described in detail with reference to FIGS. 2 to 4. The encapsulation layer ECP may be disposed on the pixels to protect the pixels.

The display device DD may further include a touch panel disposed on the encapsulation layer ECP and a window disposed on the touch panel. The touch panel may include a plurality of touch sensing units disposed on the encapsulation layer ECP. The touch sensing units may be configured to sense an external touch, and to provide an input signal in response thereto.

The display panel DP may display an image in response to the input signal. The window may protect an upper portion of the touch panel from external impact that may otherwise cause scratches. When the display device DD does not have a touch function, the touch panel might not be used in the display device DD.

A first area A1 is a predetermined portion of the flexible circuit board FPC, which is adjacent to one side of the flexible circuit board FPC, may be connected to the display panel DP. For example, a pad PD may be disposed on a predetermined portion of the substrate SUB, which is adjacent to one side of the substrate SUB. The one side of the substrate SUB on which the pad PD is disposed may be one of the short sides of the substrate SUB. The first area A1 of the flexible circuit board FPC may be disposed on the pad PD, and the first area A1 may be electrically connected to the pad PD.

An opposite side of the one side of the flexible circuit board FPC may be the other side of the flexible circuit board FPC. The driving integrated circuit D-IC may be disposed on a lower portion of a second area A2, which is a predetermined portion of the flexible circuit board FPC, which is adjacent to the other side of the flexible circuit board FPC.

For convenience of description, the pad PD and the driving integrated circuit D-IC, which are disposed on a lower portion of the flexible circuit board FPC and thus not seen by the flexible circuit board FPC, are illustrated by dotted lines in FIG. 1.

A plurality of lines connected to the driving integrated circuit D-IC may be disposed in the flexible circuit board FPC. Also, a plurality of first pad electrodes may be disposed on the first area A1, and the pad PD may include a plurality of second pad electrodes. The lines may extend from the driving integrated circuit D-IC and may be connected to the first pad electrodes, respectively.

An anisotropic conductive film (ACF) may be disposed between the first pad electrodes and the second electrodes. As the first area A1 is pressed by the pad PD, the first pad electrodes may be electrically connected to the second pad electrodes by the ACF, respectively.

The first protection film PF1 may be disposed on a lower portion of the substrate SUB. A rear surface of the substrate SUB may define a rear surface of the display panel DP. The first protection film PF1 may protect the rear surface of the display panel DP. The first protection film PF1 may be flexible. For example, the first protection film PF1 may contain a plastic material such as Polyethylene terephthalate (PET).

The substrate SUB may have a length that is greater than that of the first protection film PF1 in the first direction DR1. The length of the substrate SUB in the first direction may be a distance between one side of the substrate SUB and the other side of the substrate SUB, which is a side opposite to the one side. The length of the first protection film PF1 in the first direction may be a distance between one side of the first protection film PF1 and the other side of the first protection film PF1, which is a side opposite to the one side.

The second protection film PF2 may have a length that is less than that of the first protection film PF1 in the first direction DR1. The length of the second protection film PF2 in the first direction may be a distance between one side of the second protection film PF2 and the other side of the second protection film PF2, which is a side opposite to the one side.

The one side of the substrate SUB, the one side of the first protection film PF1, and the one side of the second protection film PF2 may be closer to the flexible circuit board FPC than the other side of the substrate SUB, the other side of the first protection film PF1, and the other side of the second protection film PF2, respectively. The one side of the substrate SUB, the one side of the first protection film PF1, and the one side of the second protection film PF2 might not overlap each other. The other side of the substrate SUB, the other side of the first protection film PF1, and the other side of the second protection film PF2 may overlap each other.

The one side of the first protection film PF1 may be spaced apart from the one side of the substrate SUB. For example, the one side of the first protection film PF1 may be disposed on a predetermined portion of the substrate SUB, which is adjacent to the one side of the substrate SUB.

The one side of the second protection film PF2 may be spaced apart from the one side of the first protection film PF1. For example, the one side of the second protection film PF2 may be disposed on a lower portion of a predetermined portion of the first protection film PF1, which is adjacent to the one side of the first protection film PF1.

An adhesion member may be disposed between the substrate SUB and the first protection film PF1. The first protection film PF1 may be attached to a bottom surface of the substrate SUB by the adhesion member.

For example, the second protection film PF2 may be disposed on a lower portion of a predetermined portion of the first protection film PF1, which is adjacent to the one side of the first protection film PF1. The second protection film PF2 may be a buffering member having a predetermined elasticity and may include a double-sided adhesive tape. For example, an adhesive agent may be applied to each of top and bottom surfaces of the second protection film PF2. The top surface of the second protection film PF2 may be attached to a bottom surface of the first protection film PF1.

A coating layer CL and a reinforcing layer SM1 may be disposed on a lower portion of the flexible circuit board FPC. Detailed configurations of the coating layer CL and the reinforcing layer SM1 will be described below in detail with reference to FIGS. 5 and 6.

Figure 2:
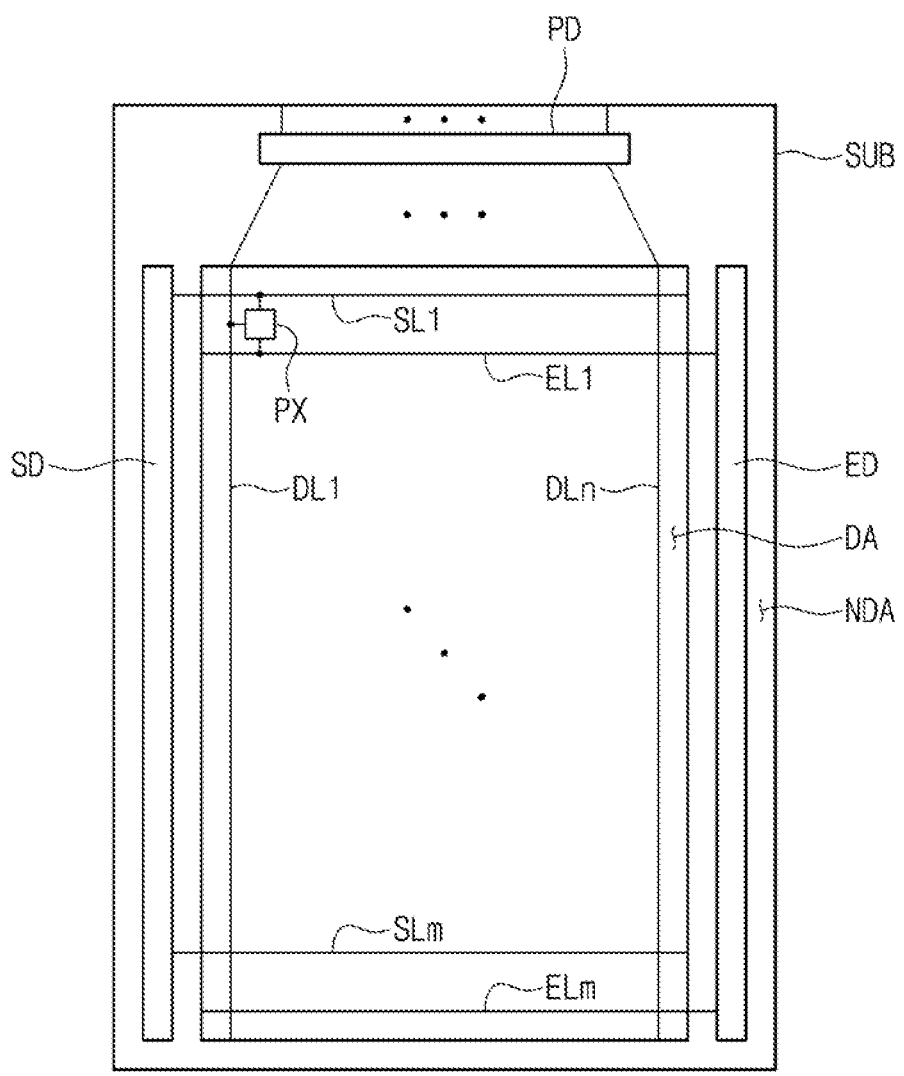
FIG. 2 is a plan view illustrating a substrate in FIG. 1.

FIG. 2 is a plan view illustrating the substrate in FIG. 1.

Referring to FIG. 2, the display device DD may include a plurality of pixels PX disposed on the substrate SUB, a plurality of scan lines SL1 to SLm, a plurality of data lines DL1 to DLn, a plurality of emission lines EL1 to ELn, a scan driver SD, and an emission driver ED. Here, m and n are natural numbers. The driving integrated circuit D-IC in FIG. 1 may be a data driver.

The substrate SUB may include a display area DA and a non-display area NDA surrounding the display area DA. The display area DA may display an image, and the non-display area NDA might not display an image.

The pixels PX may be disposed on the display area DA and may be connected to the scan lines SL1 to SLm, the data lines DL1 to DLn, and the emission lines EL1 to ELm. For convenience of description, although one pixel PX is illustrated in FIG. 2, a plurality of pixels PX may be substantially disposed on the substrate SUB. The pixels PX may be arranged in various forms. For example, although the pixels PX may be arranged in a matrix form having regular rows and columns, the present invention is not limited thereto and the pixels PX may be arranged in a staggered form or in another manner.

The scan driver SD and the emission driver may be disposed on the non-display area NDA. The scan driver SD may face the emission driver ED with the display area DA disposed therebetween. The scan driver SD may be disposed on the non-display area NDA adjacent to one of the long sides of the substrate SUB. The emission driver ED may be disposed on the non-display area NDA adjacent to the other of the long sides of the substrate SUB.

The data lines DL1 to DLn may extend in the first direction DR1 and may be electrically connected to the pad electrodes of the pad PD, respectively. As described above, since the driving integrated circuit D-IC is connected to the pad PD, the driving integrated circuit D-IC may be connected to the data lines DL1 to DLn through the pad PD.

The scan lines SL1 to SLm may extend in the second direction DR2 and may be connected to the scan driver SD. The emission lines EL1 to ELm may extend in the second direction DR2 and may be connected to the emission driver ED.

The scan driver SD may generate a plurality of scan signals, and the scan signals may be applied to the pixels PX through the scan lines SL1 to SLm. The scan signals may be sequentially applied to the pixels PX.

The driving integrated circuit D-IC may generate a plurality of data voltages, and the data voltages may be applied to the pixels PX through the data lines DL1 to DLn. The emission driver ED may generate a plurality of emission signals, and the emission signals may be applied to the pixels PX through the emission lines EL1 to ELm.

The pixels PX may receive the data voltages in response to the scan signals. The pixels PX may display an image by emitting light having luminance corresponding to the data voltages in response to the emission signals. The pixels PX may have an emission time that is controlled by the emission signals.

Figure 3:
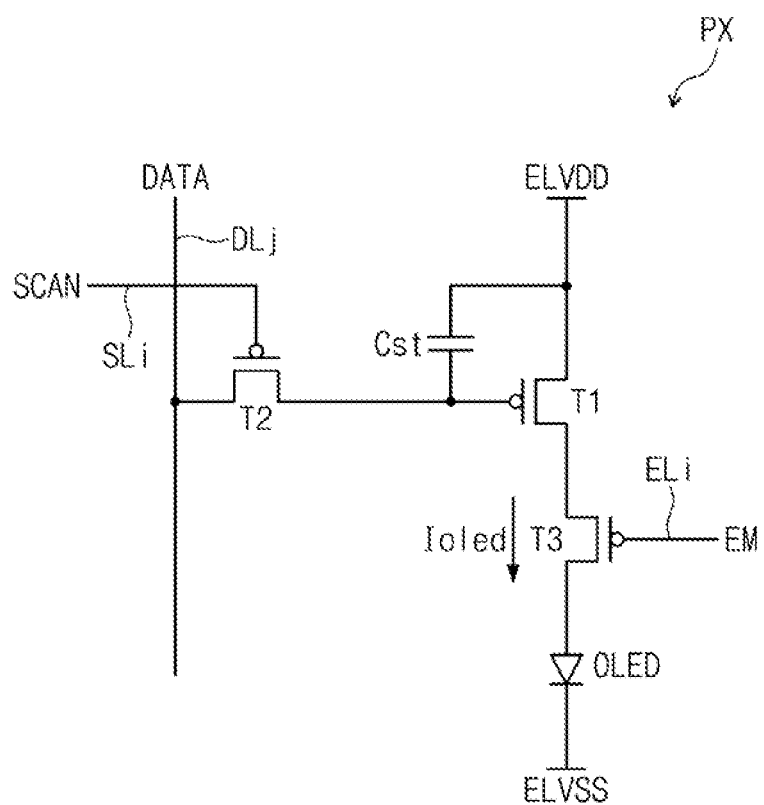
FIG. 3 is an equivalent circuit diagram illustrating a pixel in FIG. 2.

FIG. 3 is an equivalent circuit diagram illustrating the pixel in FIG. 2. The pixels PX disposed on the substrate SUB may have the same configuration as the pixel in FIG. 3.

Referring to FIG. 3, the pixel PX may be connected to a corresponding scan line SLi of the scan lines SL1 to SLm, a corresponding data line DLj of the data lines DL1 to DLn, and a corresponding emission line Eli of the emission lines EL1 to Elm. Here, i is a positive integer equal to or less than m, and j is a positive integer equal to or less than n.

The pixel PX includes a light emitting element OLED, a driving transistor T1, a capacitive element Cst, a switching transistor T2, and a light emitting control transistor T2. The light emitting element OLED may be an organic light emitting diode.

The driving transistor T1 may include a source terminal receiving a first voltage ELVDD and a drain terminal connected to a source terminal of the light emitting control transistor T3. The driving transistor T1 may include a gate terminal connected to a drain terminal of the switching transistor T2.

The switching transistor T2 may include a gate terminal connected to the scan line SLi and a source terminal connected to the data line DLj. The capacitive element Cst may include a first electrode connected to a source terminal of the driving transistor T1 and a second electrode connected to a gate terminal of the driving transistor T1.

The light emitting control transistor T3 may include a gate terminal connected to an emission line ELi and a drain terminal connected to an anode terminal of the light emitting element OLED. A cathode electrode of the light emitting element OLED may receive a second voltage ELVSS, and the second voltage ELVSS may have a level that is less than that of the first voltage ELVDD.

The switching transistor T2 may be turned-on in response to a scan signal SCAN received through the scan line SLi. The turned-on switching transistor T2 may provide a data voltage DATA received through the data line DLj to the gate terminal of the driving transistor T1.

The capacitive element Cst may charge the data voltage DATA applied to the gate terminal of the driving transistor T1 and maintain the data voltage DATA even after the switching transistor T2 is turned-off.

A gate terminal of the light emitting control transistor T3 may be turned-on in response to an emission signal EM received through the emission line ELi. The turned-on light emitting control transistor T3 may provide a current Ioled flowing through the driving transistor T1 to the light emitting element OLED. The pixel PX may emit light during an application time of the emission signal EM. The light emitting element OLED may emit light while varying an intensity of the light according to an amount of the received current Ioled.

For example, although transistors T1 to T3 of the pixel PX are PMOS transistors, the present invention is not limited thereto. For example, the transistors T1 to T3 of the pixel PX may be NMOS transistors.

Figure 4:
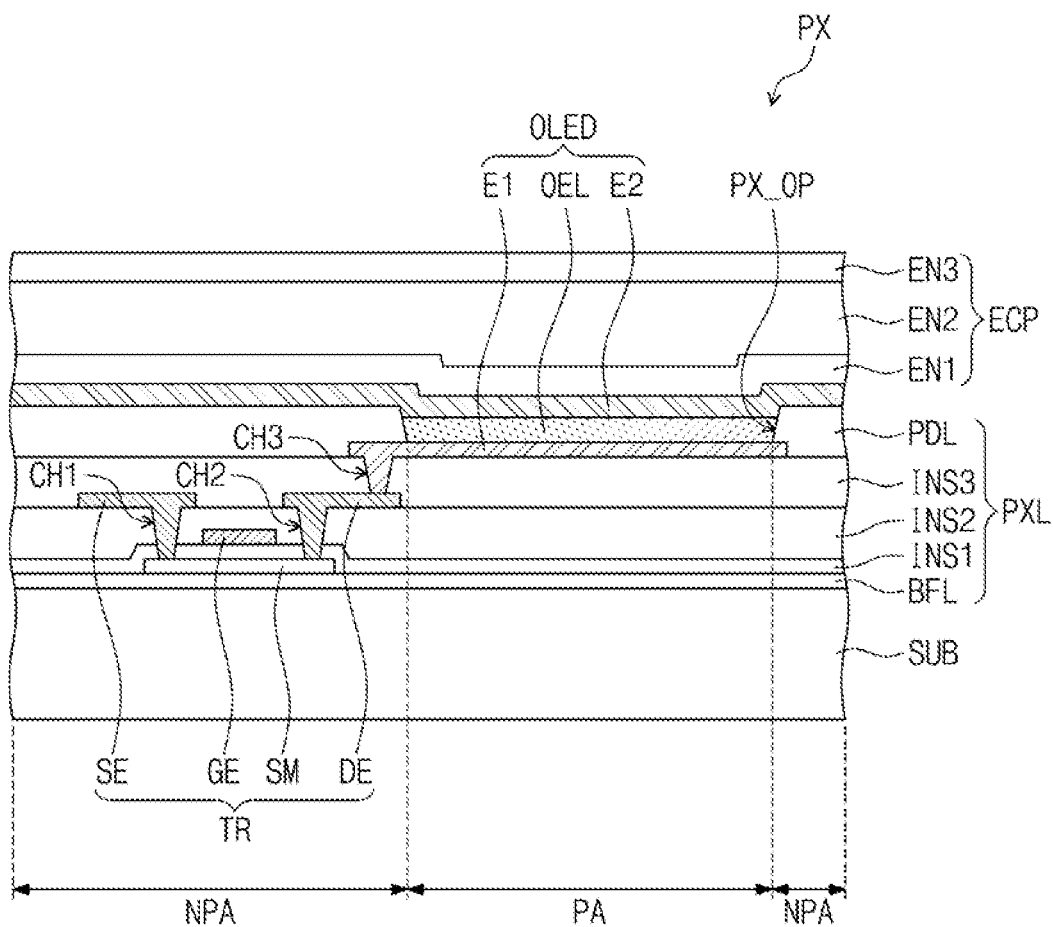
FIG. 4 is a schematic diagram illustrating a cross-sectional configuration of the pixel in FIG. 3.

FIG. 4 is a schematic diagram illustrating a cross-sectional configuration of the pixel in FIG. 3.

Referring to FIG. 4, the pixel PX includes a light emitting element OLED and a transistor TR connected to the light emitting element OLED. The pixel PX may be divided into a pixel area PA and a non-pixel area NPA that at least partially surrounds the pixel area PA. The light emitting element OLED may be disposed on the pixel area PA, and the transistor TR may be disposed on the non-pixel area NPA.

The pixel area PA, on which the light emitting element OLED is disposed, may be an emission area. The non-pixel area NPA, on which the transistor TR is disposed, may be a circuit area that is a non-emission area.

The transistor TR may be the light emitting control transistor T3. The transistor TR and the light emitting element OLED may be disposed on the substrate SUB. A buffer layer BFL may be disposed on the substrate SUB, and the buffer layer BFL may contain an inorganic material.

A semiconductor layer SM of the transistor TR may be disposed on the buffer layer BFL. The semiconductor layer SM may include an inorganic material semiconductor such as amorphous silicon or poly silicon or an organic semiconductor. Alternatively, the semiconductor layer SM may include an oxide semiconductor. The semiconductor layer SM may include a source region, a drain region, and a channel region disposed between the source region and the drain region.

A first insulation layer INS1 may be disposed on the buffer layer BFL and may cover the semiconductor layer SM. The first insulation layer INS1 may contain an inorganic material. A gate electrode GE of the transistor TR, which overlaps the semiconductor layer SM, may be disposed on the first insulation layer INS1. The gate electrode GE may overlap the channel region of the semiconductor layer SM.

A second insulation film INS2 may be disposed on the first insulation film INS1 to cover the gate electrode GE. The second insulation layer INS2 may be an interlayer insulation layer. The second insulation layer INS2 may contain an organic material and/or an inorganic material.

A source electrode SE and a drain electrode DE of the transistor TR may be spaced apart from each other on the second insulation layer INS2. The source electrode SE may be connected to the source region of the semiconductor layer SM through a first contact hole CH1 passing through the first insulation layer INS1 and the second insulation layer INS2. The drain electrode DE may be connected to the drain region of the semiconductor layer SM through a second contact hole CH2 passing through the first insulation layer INS1 and the second insulation layer INS2.

A third insulation layer INS3 may be disposed on the second insulation layer INS2 and may cover the source electrode SE and the drain electrode DE of the transistor TR. The third insulation layer INS3 may be a flattening layer providing a flat top surface and contain an organic material.

A first electrode E1 of the light emitting element OLED may be disposed on the third insulation layer INS3. The first electrode E1 may be connected to the drain electrode DE of the transistor TR through a third contact hole H3 passing through the third insulation layer INS3. The first electrode E1 may be defined as a pixel electrode or an anode electrode. The first electrode E1 may include a transparent electrode or a reflective electrode.

A pixel defining layer PDL exposing a predetermined area of the first electrode E1 may be disposed on the first electrode E1 and the third insulation layer INS3. An opening portion PX_OP for exposing a predetermined portion of the first electrode E1 may be defined in the pixel defining layer PDL.

An organic light emitting layer OEL may be disposed on the first electrode E1 within the opening portion PX_OP. The organic light emitting layer OEL may generate red, green, and/or blue light. However, the present invention is not limited thereto. For example, the organic light emitting layer OEL may generate white light by combining organic materials that generate red, green, and blue light.

A second electrode E2 may be disposed on the pixel defining layer PDL and the organic light emitting layer OEL. The second electrode E2 may be a common electrode or cathode electrode. The second electrode E2 may include a transparent electrode or a reflective electrode.

When the display panel DP is a front light emitting type organic light emitting display panel, the first electrode E1 may be provided with the reflective electrode and the second electrode E2 may be provided with the transparent electrode. When the display panel DP is a rear light emitting type organic light emitting device, the first electrode E1 may be provided with the transparent electrode, and the second electrode E2 may be provided with the reflective electrode.

The organic light emitting element OLED disposed on the pixel area PA may include the first electrode E1, the organic light emitting layer OEL, and the second electrode E2. The first electrode E1 may be a positive electrode that is a hole injection electrode, and the second electrode E2 may be a negative electrode that is an electron injection electrode.

The encapsulation layer ECP may be disposed on the light emitting element OLED and may cover the pixel PX. For example, the encapsulation layer ECP in FIG. 4 may be a thin-film encapsulation layer including a plurality of organic and inorganic material layers.

The encapsulation layer ECP may include a first encapsulation layer EN1 disposed on the light emitting element OLED, a second encapsulation layer EN2 disposed on the first encapsulation layer EN1, and a third encapsulation layer EN3 disposed on the second encapsulation layer EN2. Each of the first and third encapsulation layers EN1 and EN3 may contain an inorganic material, and the second encapsulation layer EN2 may contain an organic material. The second encapsulation layer EN2 may have a thickness greater than that of each of the first and third encapsulation layers EN1 and EN3.

A layer between the substrate SUB and the encapsulation layer ECP may be a pixel layer PXL including the pixel PX.

The first voltage ELVDD may be applied to the first electrode E1, and the second voltage ELVSS may be applied to the second electrode E2 by the transistor TR so that the organic light emitting layer OEL emits light. In this case, holes and electrons that are injected into the organic light emitting layer OEL are rejoined to provide an exciton, and while the exciton relaxes to the ground state, the light emitting element OLED may emit light. As the light emitting element OLED emits red, green, or blue light according to a current flow, a predetermined image may be displayed.

Figure 5:
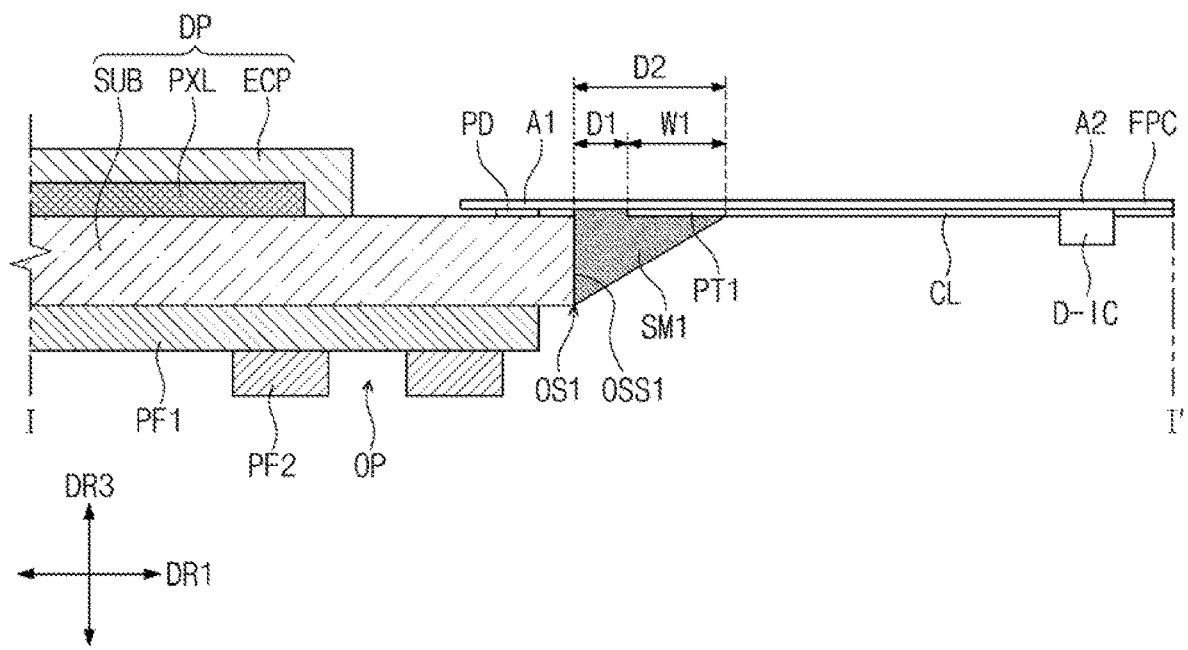
FIG. 5 is a cross-sectional view taken along line I-I' of FIG. 1.
Figure 6:
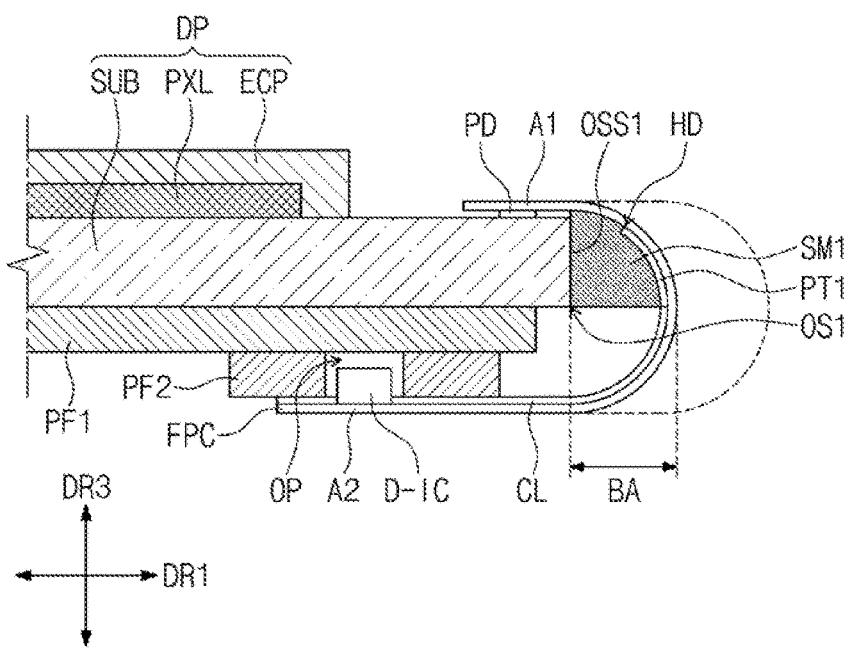
FIG. 6 is a schematic diagram illustrating a bending state of a flexible circuit board in FIG. 5.

FIG. 5 is a cross-sectional view taken along line I-I' of FIG. 1. FIG. 6 is a diagram illustrating a bending state of the flexible circuit board in FIG. 5.

Referring to FIG. 5, the pixel layer PXL may be disposed on the substrate SUB, and the encapsulation layer ECP may be disposed on the substrate SUB to cover the pixel layer PXL. The encapsulation layer ECP may be disposed on the substrate SUB while being spaced apart from one side OS of the substrate SUB. The encapsulation layer ECP may be a thin-film encapsulation layer including the first, second, and third encapsulation layers EN1, EN2, and EN3 in FIG. 4. For convenience of description, the encapsulation layer ECP is illustrated as a single layer without being divided into the first, second, and third encapsulation layers EN1, EN2, and EN3 in FIG. 5.

The first protection film PF1 may be disposed on a lower portion of the substrate SUB, and the second protection film PF2 may be disposed on a lower portion of the first protection film PF1. An opening portion OP may be defined in the second protection film PF2 by removing a predetermined portion of the second protection film PF2.

The substrate SUB may have a thickness that is greater than that of each of the first and second protection films PF1 and PF2. For example, the substrate SUB may have a thickness of about 200 μm, and each of the first and second protection films PF1 and PF2 may have a thickness on the order of several tens of μm.

The thickness of the substrate SUB may be a distance between the bottom surface and the top surface of the substrate SUB. The thickness of each of the first and second protection films PF1 and PF2 may be a distance between the bottom surface and the top surface of each of the first and second protection films PF1 and PF2. Each of the top surface and the bottom surface of the substrate SUB may be a plane defined by the first and second directions DR1 and DR2.

As described above, the one side of the first protection film PF1 may be spaced apart from the one side OS1 of the substrate SUB while being disposed on a lower portion of a predetermined portion of the substrate SUB, which is adjacent to the one side OS1 of the substrate SUB. Also, the one side of the second protection film PF2 may be spaced apart from the one side of the first protection film PF1 while being disposed on a lower portion of a predetermined portion of the first protection film PF1, which is adjacent to the one side of the first protection film PF1. The flexible circuit board FPC may have a first area A1 connected to the pad PD and a second area A2 below which the driving integrated circuit D-IC is disposed.

A coating layer CL may be disposed on a lower portion of the flexible circuit board FPC. The coating layer CL may surround the driving integrated circuit D-IC. The coating layer CL may be an insulation layer containing an insulating material and may be a solder resist. The coating layer CL may cover lines disposed on the flexible circuit board FPC to protect the lines. For example, the coating layer CL may have an elastic modulus of about 900 MPA.

Since the coating layer CL is an insulation layer, when the coating layer CL is disposed on a lower portion of the first area A1, the first area A1 might not be electrically connected to the pad PD. Accordingly, the coating layer CL is not disposed on a lower portion of the first area A1. For example, the coating layer CL may be spaced a predetermined distance from the one side OS1 of the substrate SUB so as to be spaced apart from the pad PD.

In a manufacturing process, the coating layer CL may be difficult to be precisely arranged to the one side OS1 of the substrate SUB. Accordingly, the coating layer CL may be spaced a predetermined distance from the one side OS1 of the substrate SUB so as to have a predetermined tolerance (e.g. to experience no more than a predetermined level of error during a process).

One side of the coating layer CL may be a side facing the one side OS1 of the substrate SUB. A predetermined portion of the coating layer CL, which is adjacent to the one side of the coating layer CL, may be a first portion PT1. For convenience of description, a boundary of the first portion PT1 is illustrated in the coating layer CL in FIGS. 5 and 6.

The reinforcing layer SM1 is disposed on a lower portion of the flexible circuit board FPC. The reinforcing layer SM1 may be disposed between the one side OS1 of the substrate and the coating layer CL and may cover one side of the coating layer CL. For example, the reinforcing layer SM1 disposed between the one side OS1 of the substrate and the coating layer CL may extend until the first portion PT1 and may be disposed on a lower portion of the first portion PT1 and may cover the one side of the coating layer CL. For example, the coating layer CL may be disposed on a bottom surface of the first portion PT1.

The reinforcing layer SM1 may be disposed on the one side OS1 of the substrate SUB while being spaced apart from the pad PD. For example, since the pad PD is disposed between the substrate SUB and the first area A1, a predetermined space may be defined between the substrate SUB and the flexible circuit board FPC by the pad PD. The reinforcing layer SM1 may be disposed between the one side OS1 of the substrate SUB and the flexible circuit board FPC so that the boundary of the reinforcing layer SM1 overlaps the one side OS1 of the substrate SUB.

A side surface of the substrate SUB, which defines the one side OS1 of the substrate SUB, may be one side surface OSS1 of the substrate SUB. The one side OS1 may represent an end of the substrate SUB, which is an edge of the substrate SUB, and the one side surface OSS1 may represent a two-dimensional side surface of the substrate SUB, which is provided at the one side OS1.

The reinforcing layer SM1 may be disposed on the one side surface OSS1 of the substrate SUB. In exemplary an embodiment of the present inventive concept, as illustrated in FIG. 5, although the reinforcing layer SM1 may be disposed on the entire one side surface OSS1 of the substrate SUB, the present invention is not limited thereto. For example, the reinforcing layer SM1 may be disposed on a predetermined portion of the one side surface OSS1 of the substrate SUB. For example, the reinforcing layer SM1 may be disposed on the one side surface OSS1 of the substrate SUB while being spaced a predetermined distance upward from a lower end of the one side surface OSS1 of the substrate SUB.

The first portion PT1 may have one side that is one side of the coating layer CL and the other side that is an opposite side of the one side of the first portion PT1. In the third direction DR3, the reinforcing layer SM1 may have a thickness that gradually decreases from the one side OS1 of the substrate SUB to the other side of the first portion PT1. When the flexible circuit board FPC is in a flat state without being bent, a bottom surface of the reinforcing layer SM1 may be an inclined surface leading from the lower end of the one side surface OSS1 of the substrate SUB to the other side of the first portion PT1.

Hereinafter, a distance between the one side OS1 of the substrate SUB and the one side of the first portion PT1 is a first distance D1, and a distance between the one side OS1 of the substrate SUB and the other side of the first portion PT1 is a second distance D2. Also, a width of the first portion, which is a distance between the one side of the first portion PT1 and the other side of the first portion PT1, is a first width W1. The first width W1 may be obtained by subtracting the first distance D1 from the second distance D2.

The first width W1 may be greater than the first distance D1. However, the present invention is not limited thereto. For example, the first width W1 may be equal to or less than the first distance D1. The first distance D1 may be about 100 μm to about 200 μm. Also, the second distance D2 may be about 0.5 mm to about 1.5 mm.

The reinforcing layer SM1 may contain an insulating material. The reinforcing layer SM1 may contain a UV-curing resin. For example, the reinforcing layer SM1 may contain an acrylic resin. The resin for forming the reinforcing layer SM1 may be applied on a lower portion of the flexible circuit board FPC, and the applied resin may be cured by ultraviolet rays, thereby forming the reinforcing layer SM1. After the reinforcing layer SM1 is formed, the flexible circuit board FPC may be bent.

The reinforcing layer SM1 may have an elastic modulus that is less than that of the coating layer CL. For example, the reinforcing layer SM1 may have an elastic modulus of about 50 MPa to about 500 MPa.

Referring to FIG. 6, the flexible circuit board FPC may be bent toward a lower portion of the substrate SUB. The second area A2 of the flexible circuit board FPC may be disposed on a lower portion of the second protection film PF2. A portion of the flexible circuit board FPC, which is bent toward the lower portion of the substrate SUB, may be attached to a bottom surface of the second protection film PF2 that is a double-sided tape. The driving integrated circuit D-IC may be inserted into the opening portion OP defined in the second protection film PF2. Accordingly, the driving integrated circuit D-IC may be disposed on a lower portion of the substrate SUB in a more stable manner.

A bent portion of the flexible circuit board FPC may be a bending region BA. The bending region BA may be a dead space in which no image is displayed. In the first direction DR1, the bending region BA may have a width of about 0.3 mm to about 0.6 mm.

For example, in a stage in which the flexible circuit board FPC is bent, a bottom surface of the reinforcing layer SM1 is illustrated as a horizontal surface in parallel to the first direction DR1 in FIG. 6. However, the present invention is not limited thereto. For example, in the stage in which the flexible circuit board FPC is bent, the bottom surface of the reinforcing layer SM1 may have a surface inclined along the first width W1 of the first portion PT1 on which the reinforcing layer SM1 is disposed.

When the flexible circuit board FPC is bent while the reinforcing layer SM1 is not disposed on the flexible circuit board FPC, the flexible circuit board FPC may be more sharply bent at a stepped portion HD provided at one side of the coating layer CL. Since a portion on which the coating layer CL is not disposed exists, the stepped portion HD may be provided at one side of the coating layer CL. The stepped portion HD may be a height difference between a portion on which only the flexible circuit board FPC is disposed and a portion on which the flexible circuit board FPC and the coating layer CL are disposed together.

In this case, since the flexible circuit board FPC may be more sharply bent at the stepped portion HD, a crack may be generated in lines disposed in the flexible circuit board FPC. To resolve the above-described limitation, the bending part may be formed along a bent dotted line in FIG. 6. However, the above-described bent dotted line is further spaced apart from the one side OS1 of the substrate SUB, the dead space may increase.

Also, since a portion on which the coating layer CL is not disposed exists due to the tolerance of a process, the lines disposed in the flexible circuit board FPC on the portion in which the coating layer CL is not disposed might not be protected. Since the bending region BA corresponding to the portion in which the coating layer CL is not disposed has a thickness less than that of another bending region BA, the bending region BA of the portion in which the coating layer CL is not disposed may be vulnerable to an external impact.

In an exemplary embodiment of the present inventive concept, as the reinforcing layer SM1 is disposed between the one side OS1 of the substrate SUB and the coating layer CL, the bending region BA of the portion in which the coating layer CL is not disposed may be supported. Accordingly, the phenomenon in which the flexible circuit board FPC is more sharply bent at the stepped portion HD may be prevented, and thus the crack might not be generated on the lines on the stepped portion HD. Unlike the bent dotted line in FIG. 6, the bending region BA of the flexible circuit board FPC may be provided closer to the one side OS1 of the substrate SUB, and thus the dead space may decrease.

Since the reinforcing layer SM1 is disposed on the flexible circuit board FPC on the portion in which the coating layer CL is not disposed, the lines disposed in the flexible circuit board FPC may be protected by the reinforcing layer SM1. Also, the reinforcing layer SM1 may have a predetermined elastic force and may be configured to absorb an external impact to protect the bending region BA.

Since a restoration force of a material increases as an elastic modulus of the material increases, when the reinforcing layer SM1 has an elastic modulus greater than that of the coating layer CL, the portion of the flexible circuit board FPC, on which the reinforcing layer SM1 is disposed, may be difficult to be bent. Also, in an exemplary embodiment of the present inventive concept, with respect to the third direction DR3, the reinforcing layer SM1 may have a thickness greater than that of the coating layer CL. Accordingly, when the reinforcing layer SM1 has the same elastic modulus as the coating layer CL, the portion of the flexible circuit board FPC, on which the reinforcing layer SM1 is disposed, may be difficult to be bent.

As described above, in an exemplary embodiment of the present inventive concept, since the reinforcing layer SM1 has an elastic modulus that is less than that of the coating layer CL, the portion of the flexible circuit board FPC, on which the reinforcing layer SM1 is disposed, may be easily bent.

Figure 7:
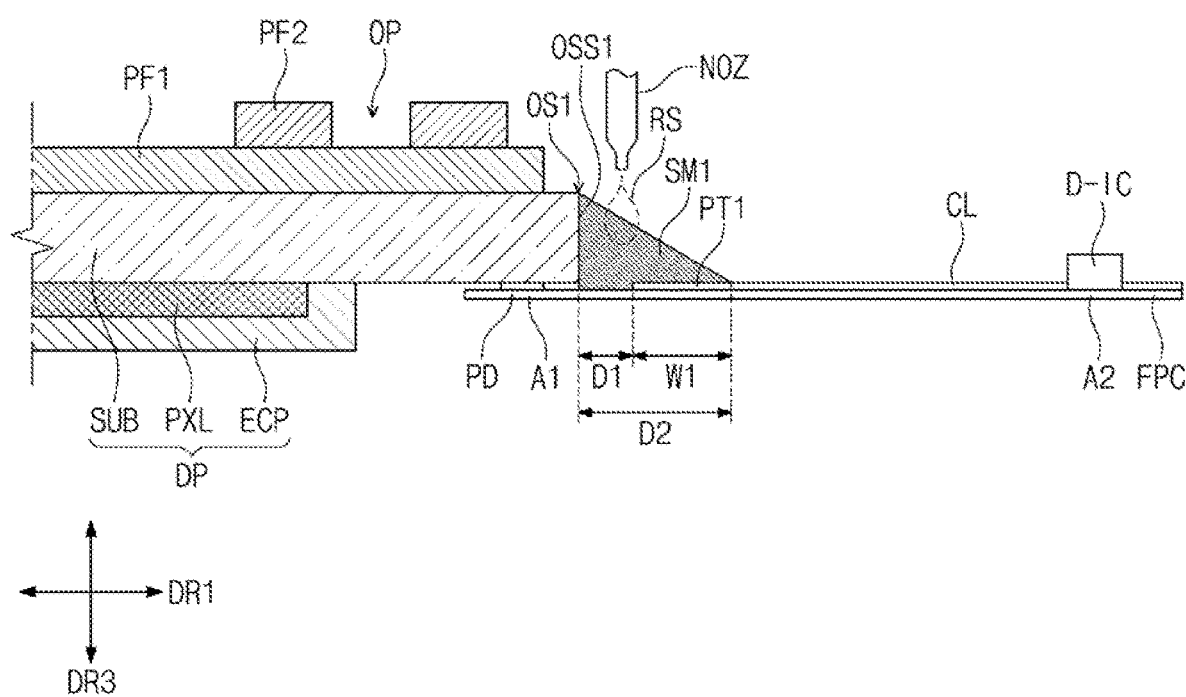
FIG. 7 is a schematic diagram illustrating a method of forming a reinforcing layer in FIG. 5 according to an exemplary embodiment of the present inventive concept.

FIG. 7 is a schematic diagram illustrating a method of forming the reinforcing layer in FIG. 5 in accordance with exemplary embodiments of the present invention.

Referring to FIG. 7, the substrate SUB in FIG. 5 may be overturned, and the coating layer CL may face upward. Accordingly, the flexible circuit board FPC between the one side OS1 of the substrate SUB and the one side of the coating layer CL may face upward.

A flowable resin RS may be discharged through a nozzle NOZ, and the resin RS may be supplied between the one side OS1 of the substrate SUB and the one side of the coating layer CL. The resin RS may be applied on the flexible circuit board FPC and then move to the one side surface OSS1 of the substrate SUB by a surface tension acting on the one side surface of the substrate SUB, thereby being disposed on the one side surface OSS1 of the substrate SUB. Also, the resin RS may flow toward the first portion PT1 and then may come to be disposed on the first portion PT1.

As described above, the resin RS may be UV-curable resin. The resin RS may be cured by ultraviolet rays to form the reinforcing layer SM1. The above-described elastic modulus of the reinforcing layer SM1 may be an elastic modulus of the cured resin RS.

Figure 8:
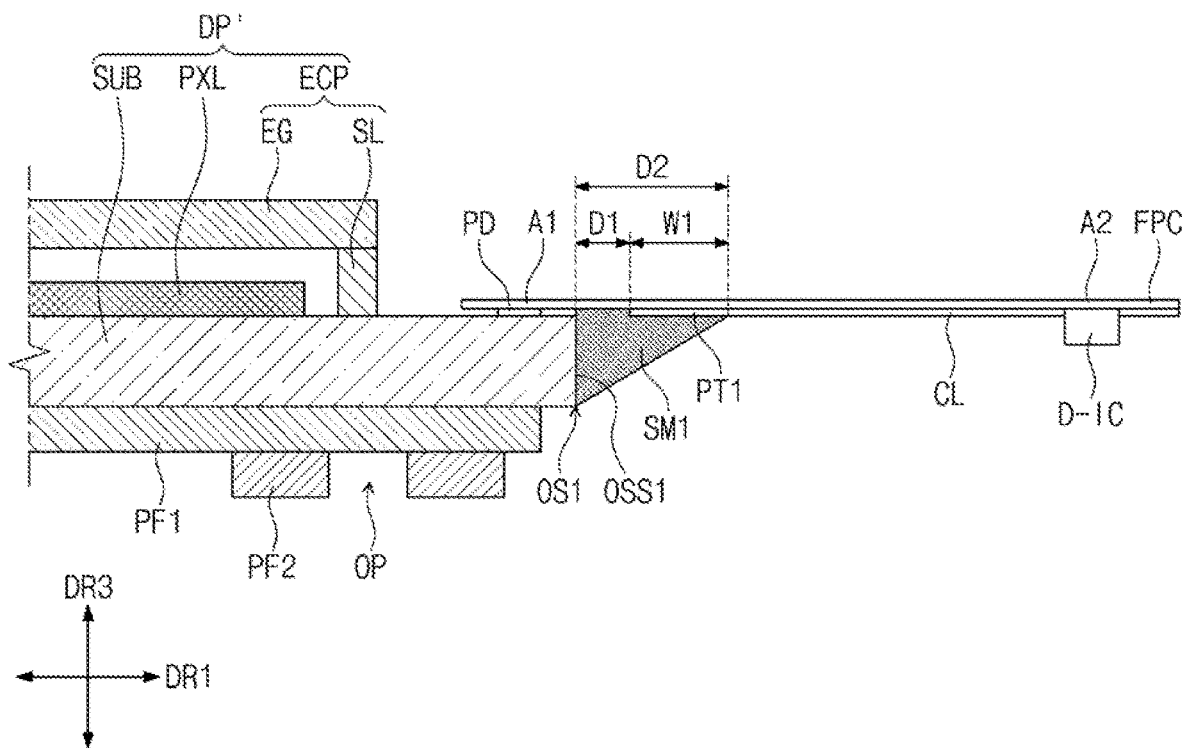
FIG. 8 is a cross-sectional view illustrating a display panel including an encapsulation substrate and a flexible circuit board connected to the display panel.
Figure 9:
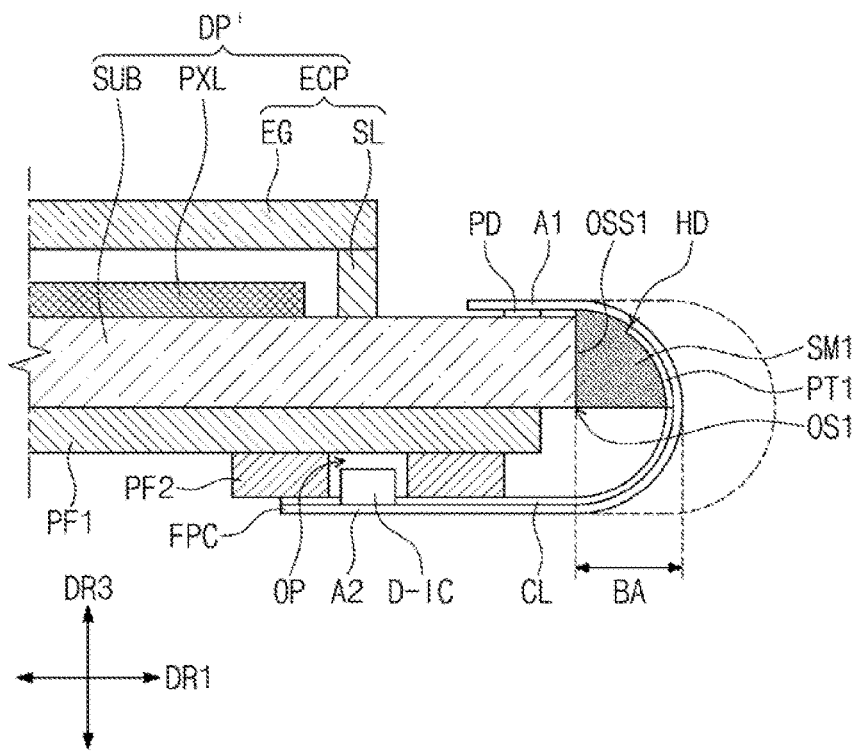
FIG. 9 is a schematic diagram illustrating a bending state of the flexible circuit board in FIG. 8.

FIG. 8 is a cross-sectional view illustrating a display panel including an encapsulation substrate and a flexible circuit board connected to the display panel. FIG. 9 is a diagram illustrating a bending state of the flexible circuit board in FIG. 8.

For convenience of description, FIGS. 8 and 9 are cross-sectional views corresponding to FIGS. 5 and 6, respectively. Except that an encapsulation substrate EG is used as the encapsulation layer ECP, other components may be the same as those of the display device DD in FIGS. 1 to 6. Thus, hereinafter, a configuration of the encapsulation substrate EG will be mainly described, and the same components will be indicated by the same reference symbols, respectively. To the extent that elements in these figures are not described herein, it may be assumed that those elements are at least similar to corresponding elements that have already been described.

Referring to FIGS. 8 and 9, an encapsulation layer ECP of a display panel DP' may include an encapsulation substrate EG disposed on the substrate SUB and a sealing layer SL coupling the substrate SUB to the encapsulation substrate EG. A pixel layer PXL may be disposed between the substrate SUB and the encapsulation substrate EG.

The sealing layer SL may be disposed around the pixel layer PXL. For example, the sealing layer SL may be disposed on the non-display area NDA of the substrate SUB so as to surround the pixels PX of the pixel layer PXL. The encapsulation substrate EG might not overlap the pad PD. The display panel DP' in FIG. 8 may be a rigid-type display panel.

The encapsulation substrate EG may include a synthetic resin substrate or a glass substrate. The sealing layer SL may include an inorganic adhesion member such as frit. However, the present invention is not limited thereto. For example, the sealing layer SL may include an organic adhesion member. In an exemplary embodiment of the present inventive concept, since the pixel layer PXL may be sealed from the outside by the encapsulation substrate EG and the sealing layer SL, the light emitting element OLED may be prevented from being damaged by moisture.

Since the reinforcing layer SM1 is disposed on a lower portion of the flexible circuit board FPC, and the flexible circuit board FPC has the same bending structure as that in FIGS. 5 and 6, redundant description will be omitted.

FIGS. 10 to 22 are views illustrating configurations of reinforcing layers according to various exemplary embodiments of the present inventive concept.

Figure 21:
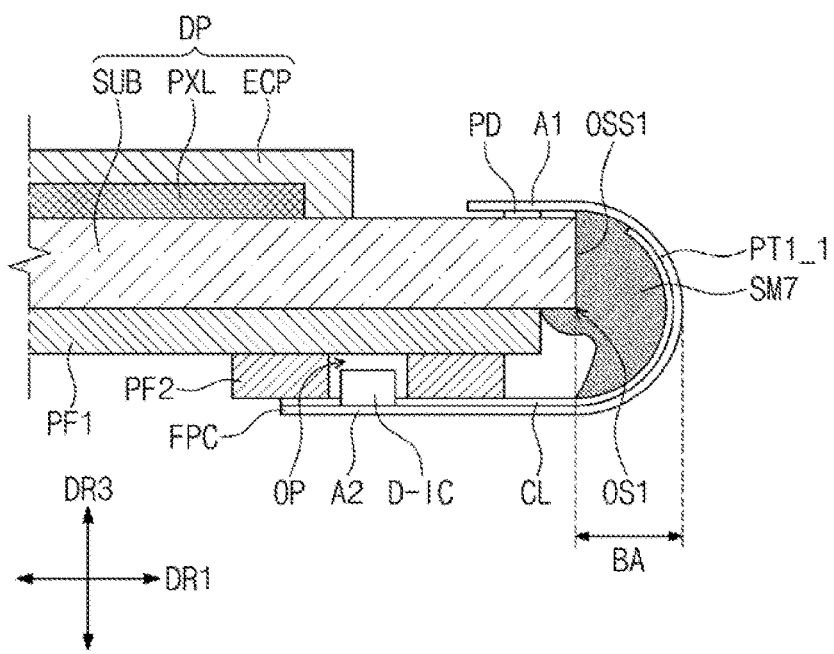
Figure 22:
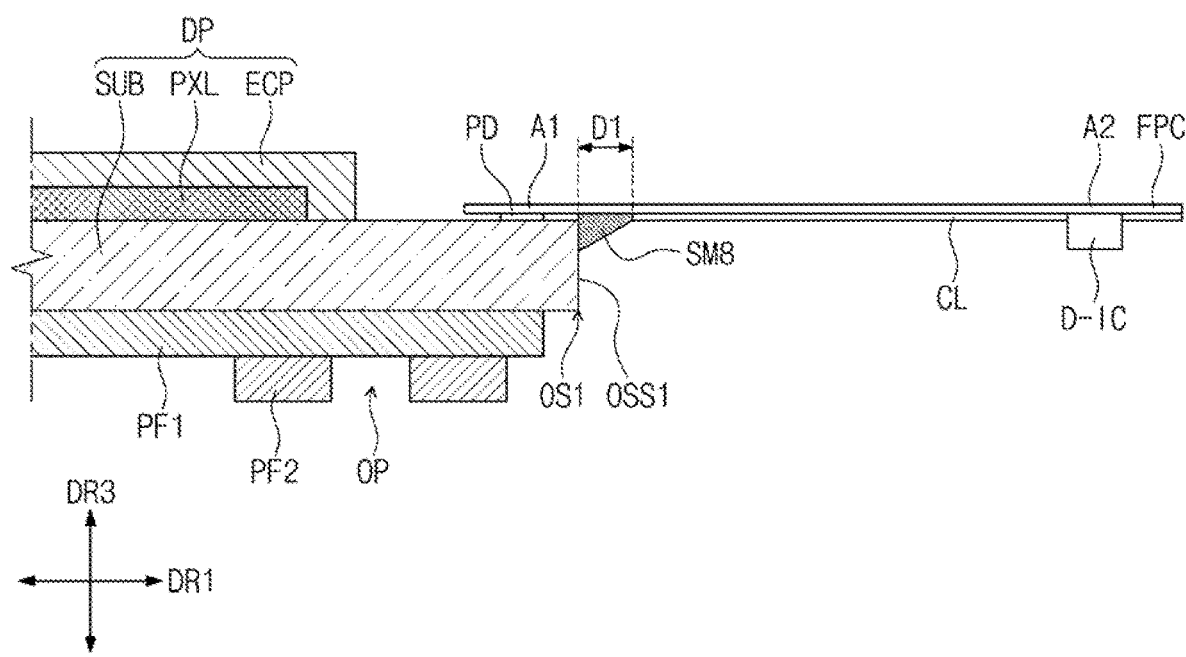

An encapsulation layer ECP in FIGS. 10 to 22 may be a thin-film encapsulation layer including first, second, and third encapsulation layers EN1, EN2, and EN3. For convenience of description, FIGS. 10 and 22 are cross-sectional views corresponding to FIGS. 5 and 6, respectively.

Except for configurations of reinforcing layers SM2 to SM8, configurations in FIGS. 10 to 22 may be the same as those in FIGS. 5 and 6. Accordingly, hereinafter, configurations of the reinforcing layers SM2 to SM8, which are different from those of the reinforcing layer SM1 in FIGS. 5 and 6, will be mainly described with reference to FIGS. 10 to 22, and the same components will be designated by the same reference symbols. To the extent that elements in these figures are not described herein, it may be assumed that those elements are at least similar to corresponding elements that have already been described.

Figure 10:
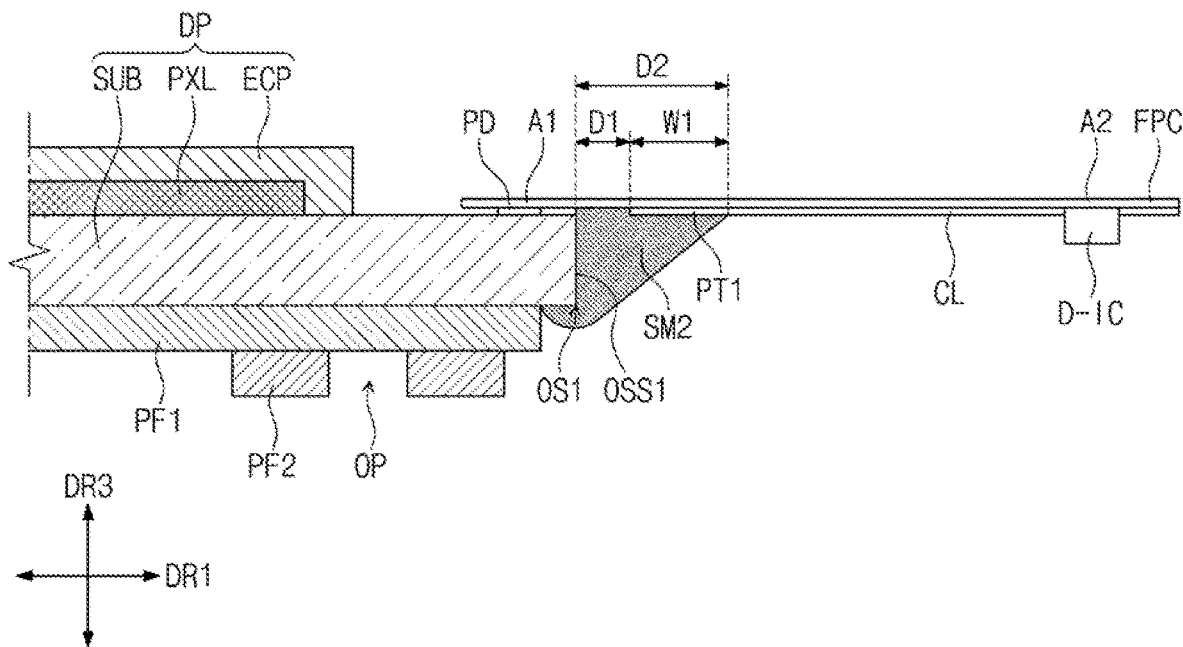
FIGS. 10 to 22 are schematic diagrams illustrating configurations of reinforcing layers according to various exemplary embodiments of the present inventive concept.
Figure 11:
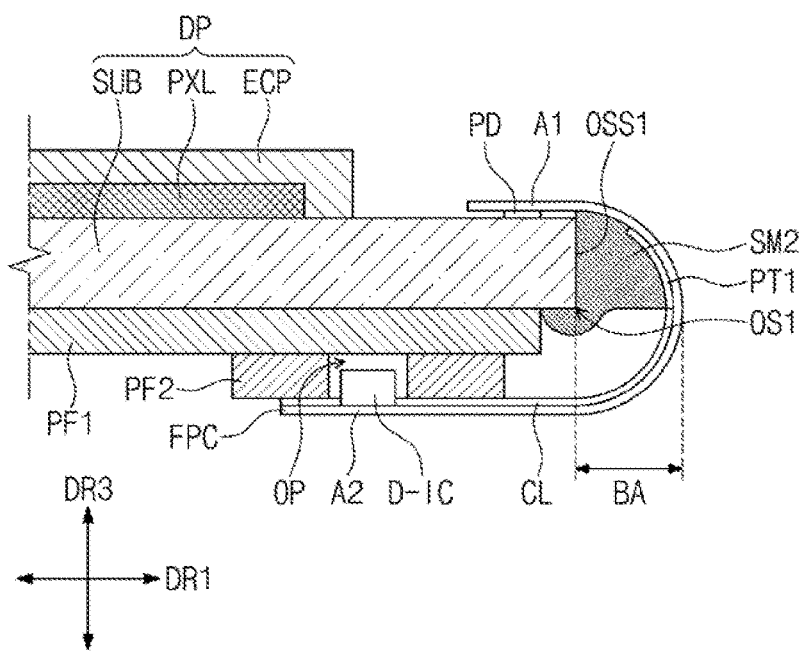

FIG. 10 is a schematic diagram illustrating configurations of a reinforcing layer according to an exemplary embodiment of the present inventive concept. FIG. 11 is a schematic diagram illustrating a bending state of a flexible circuit board in FIG. 10.

Referring to FIGS. 10 and 11, like the reinforcing layer SM1 in FIG. 5, the reinforcing layer SM2 may be disposed between one side OS1 of a substrate SUB and one side of a coating layer CL, on a lower portion of a first portion PT1, or on one side surface OSS1 of the substrate SUB. In addition, the reinforcing layer SM2 may be further disposed on a lower portion of the substrate SUB, which is adjacent to one side of a first protection film PF1, and may cover a lower end of the one side surface OSS1 of the substrate SUB.

To form the reinforcing layer SM2, the resin RS for forming the reinforcing layer SM1 in FIG. 5 may be provided, and then a predetermined amount of resin may be additionally provided on the lower portion of the substrate SUB, which is adjacent to the one side of the first protection film PF1.

The reinforcing layer SM2 disposed on the lower portion of the substrate SUB may have a protruding shape that protrudes downward. Since the reinforcing layer SM2 is greater than the reinforcing layer SM1 in FIG. 5, a bending region BA may be further supported.

Figure 12:
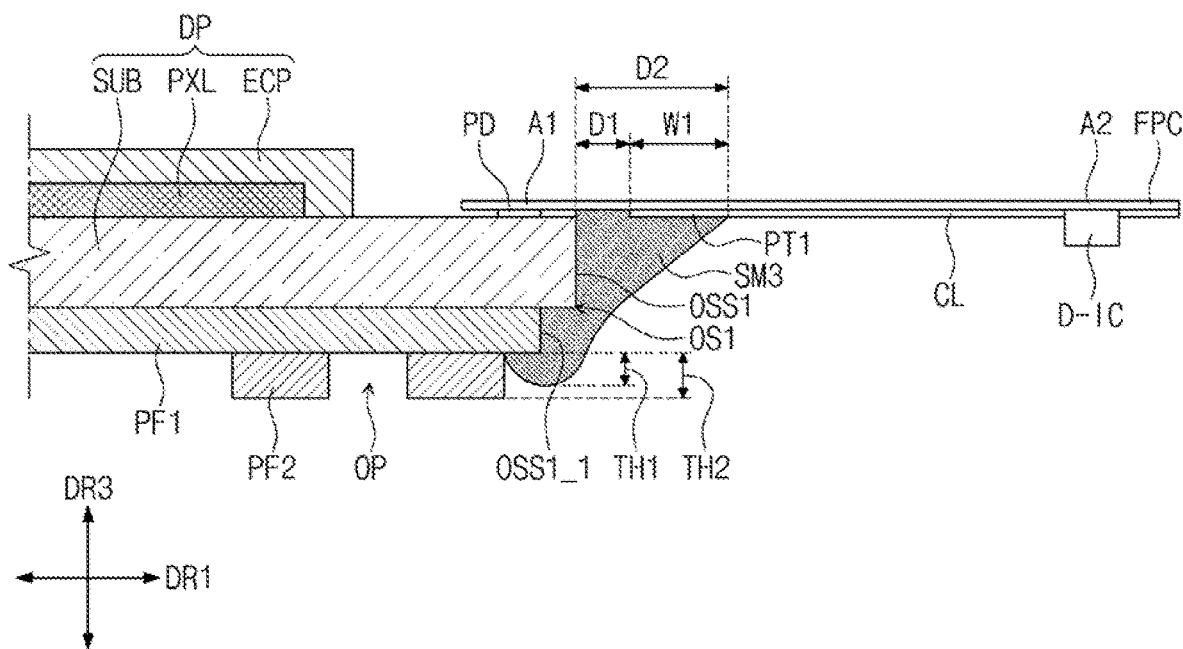
Figure 13:
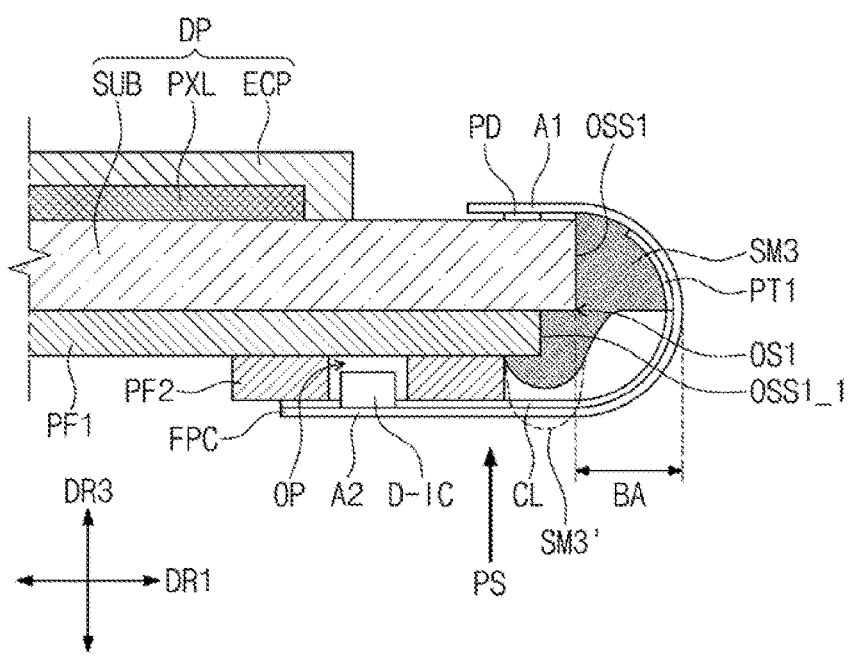

FIG. 12 is a schematic diagram illustrating configurations of a reinforcing layer according to an exemplary embodiment of the present inventive concept. FIG. 13 is a schematic diagram illustrating a bending state of the flexible circuit board in FIG. 12.

Referring to FIGS. 12 and 13, like the reinforcing layer SM1 in FIG. 5, the reinforcing layer SM3 may be disposed between one side OS1 of a substrate SUB and one side of a coating layer CL, on a lower portion of a first portion PT1, or on one side surface OSS1 of the substrate SUB. Also, like the reinforcing layer SM2 in FIG. 10, the reinforcing layer SM3 may be disposed on a lower portion of the substrate SUB, which is adjacent to one side of a first protection film PF1, and may cover a lower end of the one side surface OSS1 of the substrate SUB.

In addition, the reinforcing layer SM3 may be further disposed on a lower portion of the first protection film PF1, which is adjacent to one side of a second protection film PF2, and one side surface OSS1_1 of the first protection film PF1 and may cover a lower end of the one side surface OSS1_1 of the first protection film PF1, which defines one side of the first protection film PF1.

To form the reinforcing layer SM3, the resin for forming the reinforcing layers SM1 and SM2 in FIGS. 5 and 10 may be provided, and then a predetermined amount of resin may be additionally provided on the lower portion of the first protection film PF1, which is adjacent to the one side of the second protection film PF2, and the one side surface OSS1_1 of the first protection film PF1.

The reinforcing layer SM3 disposed on the lower portion of the first protection film PF1 may have a protruding shape that protrudes downward. Since the reinforcing layer SM3 is greater than the reinforcing layer SM1 in FIG. 5, a bending region BA may be further supported.

In the third direction DR3, a first thickness TH1 of the reinforcing layer SM3 disposed on the lower portion of the first protection film PF1 may be less than a second thickness TH2 of the second protection film PF2. As the flexible circuit board FPC is bent, a portion of the flexible circuit board FPC, which is bent to a lower portion of the second protection film PF2, may be attached to a bottom surface of the second protection film PF2.

When the first thickness TH1 is greater than the second thickness TH2, the reinforcing layer SM3 disposed on the lower portion of the first protection film PF1 may have a structure of a reinforcing layer SM3' that protrudes further downward than the second protection film PF2 as illustrated by a dotted line in FIG. 13. In this case, the portion of the flexible circuit board FPC, which is bent to the lower portion of the second protection film PF2, might not be easily attached to the bottom surface of the second protection film PF2 due to the downwardly protruding reinforcing layer SM3'.

To attach the flexible circuit board FPC to the bottom surface of the second protection film PF2, a predetermined pressure PS may be applied toward the flexible circuit board FPC bent to the lower portion of the second protection film PF2. The pressure PS may be applied stronger to the downwardly protruding reinforcing layer SM3' than the second protection film PF2. In this case, the pressure PS may be transmitted to the substrate SUB above the reinforcing layer SM3' by the reinforcing layer SM3', and the substrate SUB may be damaged by the pressure PS.

According to an exemplary embodiment of the present inventive concept, since the reinforcing layer SM3 disposed on the lower portion of the first protection film PF1 has a thickness that is less than that of the second protection film PF2, the above-described limitation is not generated.

Figure 14:
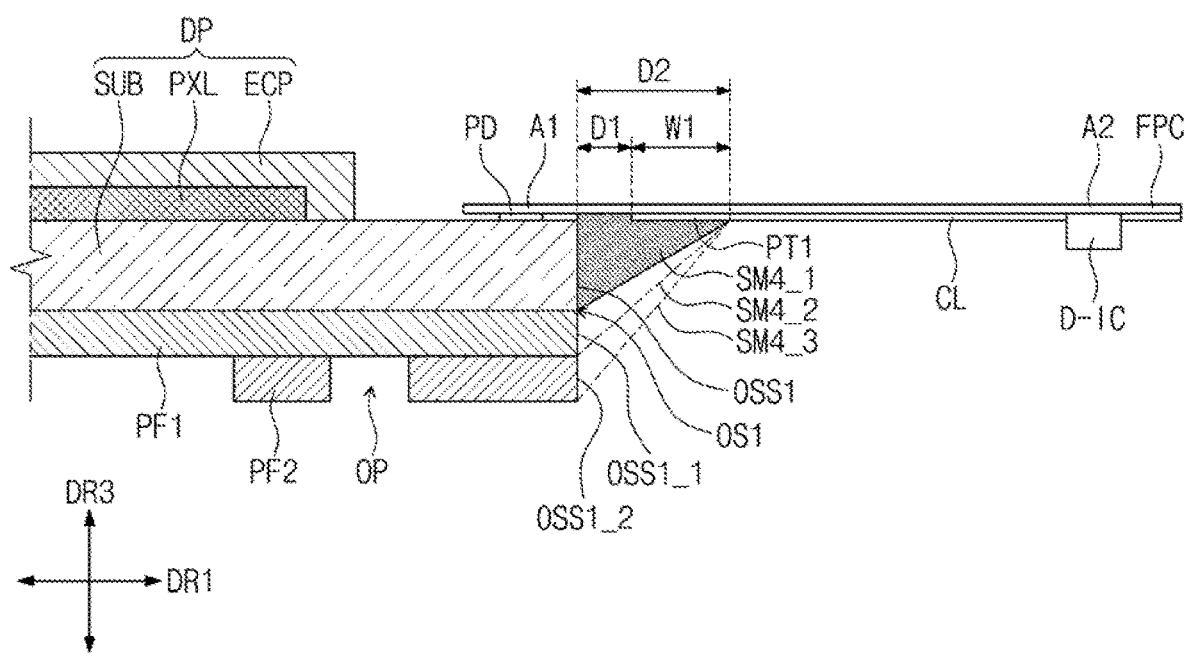

FIG. 14 is a schematic diagram illustrating configurations of reinforcing layers according to an exemplary embodiment of the present inventive concept.

Reinforcing layers SM4_1, SM4_2, and SM4_3 are configurations that are distinguished from each other, and each of the reinforcing layers SM4_2 and SM4_3 is expressed by a dotted line so as to be distinguished from the reinforcing layer SM4_1.

Referring to FIG. 14, unlike the configurations in FIG. 5, one side OS1 of a substrate SUB, one side of a first protection film PF1, and one side of a second protection film PF2 may at least partially overlap each other. The reinforcing layer SM4_1 may be the same as the reinforcing layer SM1 in FIG. 5.

In addition, the reinforcing layer SM4_2 may be disposed on one side surface OSS1 of the substrate SUB and one side surface OSS1_1 of the first protection film PF1. Also, the reinforcing layer SM4_3 may be disposed on the one side surface OSS1 of the substrate SUB, the one side surface OSS1_1 of the first protection film PF1, and one side surface OSS1_2 of the second protection film PF2, which defines the one side of the second protection film PF2.

Figure 15:
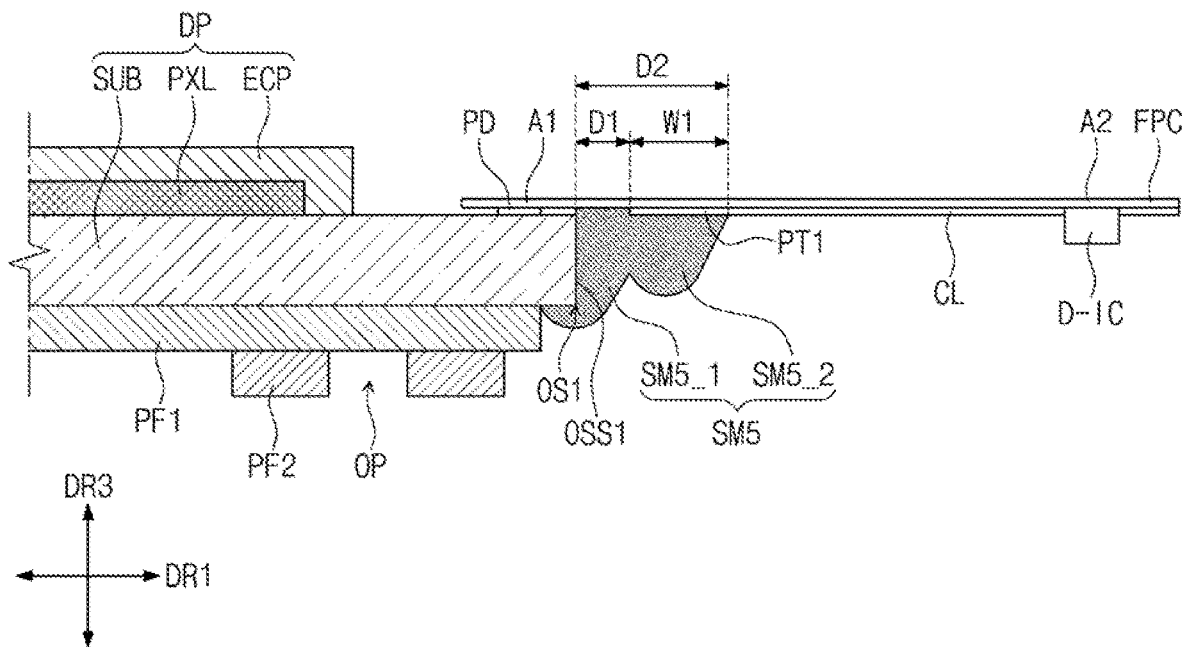
Figure 16:
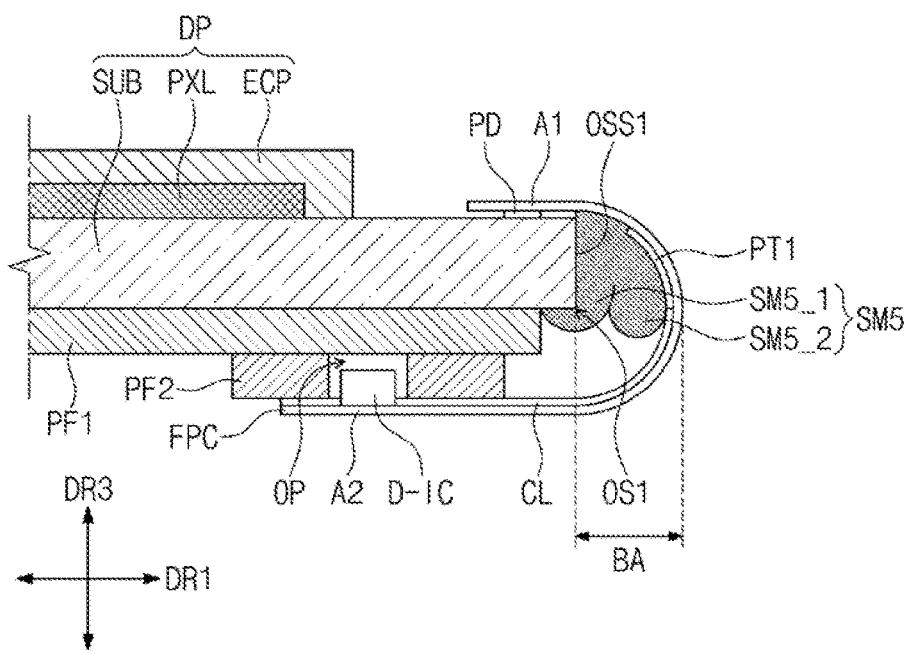

FIG. 15 is a schematic diagram illustrating a configuration of a reinforcing layer according to an exemplary embodiment of the present inventive concept. FIG. 16 is a schematic diagram illustrating a bending state of the flexible circuit board in FIG. 15.

Referring to FIGS. 15 and 16, a reinforcing layer SM5 may be disposed from a lower portion of a substrate SUB, which is adjacent to one side OS1 of the substrate SUB, to a first portion PT1 of a coating layer CL so as to be filled between one side OS1 of the substrate SUB and the coating layer CL. A lower portion of the substrate SUB, which is adjacent to the one side OS1 of the substrate SUB, may be a lower portion of the substrate SUB, which is adjacent to one side of a first protection film PF1.

The reinforcing layer SM5 may include a first protruding portion SM5_1 at least partially overlapping the lower portion of the substrate SUB, which is adjacent to the one side OS1 of the substrate SUB, and an area between the one side OS1 of the substrate SUB and the coating layer CL while protruding downward and a second protruding portion SM5_2 at least partially overlapping a first portion PT1 while protruding downward. Each of the first and second protruding portions SM5_1 and SM5_2 has a protruding shape that protrudes downward.

As illustrated in FIG. 16, since the reinforcing layer SM5 has a predetermined elastic force, when a flexible circuit board FPC is bent, the first and second protruding portions SM5_1 and SM5_2 may be deformed to be adjacent to each other.

Figure 17:
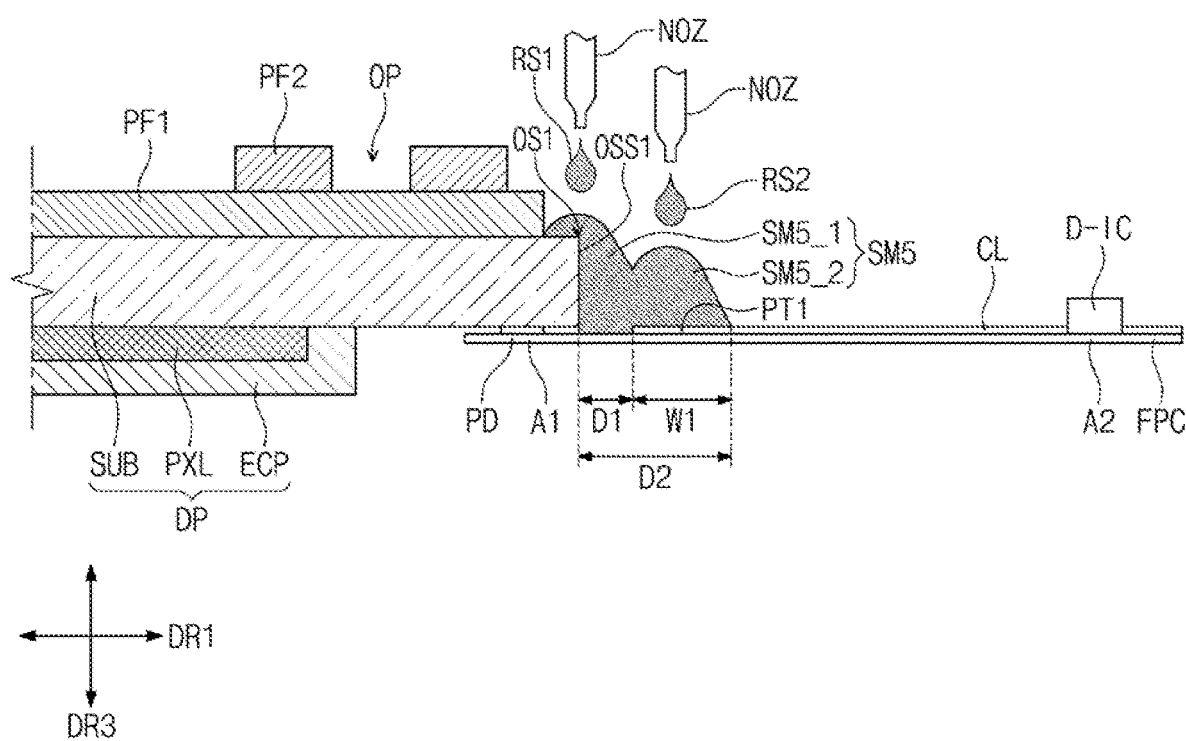

FIG. 17 is a schematic diagram illustrating a method of forming the reinforcing layer in FIG. 15.

Referring to FIG. 17, a flexible circuit board FPC between one side OS1 of a substrate SUB and one side of a coating layer CL may face upward. A first flowable resin RS1 may be discharged through a nozzle NOZ. The first resin RS1 may be provided on one side surface OSS1 of the substrate SUB and a portion of the substrate SUB, which is adjacent to one side OS1 of the substrate SUB, and between the one side OS1 of the substrate SUB and one side of the coating layer CL.

A second flowable resin RS2 may be discharged through a nozzle NOZ. The second resin RS2 may be provided on the first portion PT1. For example, the resin may be provided two times to form the reinforcing layer SM5. The resins RS1 and RS2 may be hardened by ultraviolet rays to form the reinforcing layer SM5.

Figure 18:
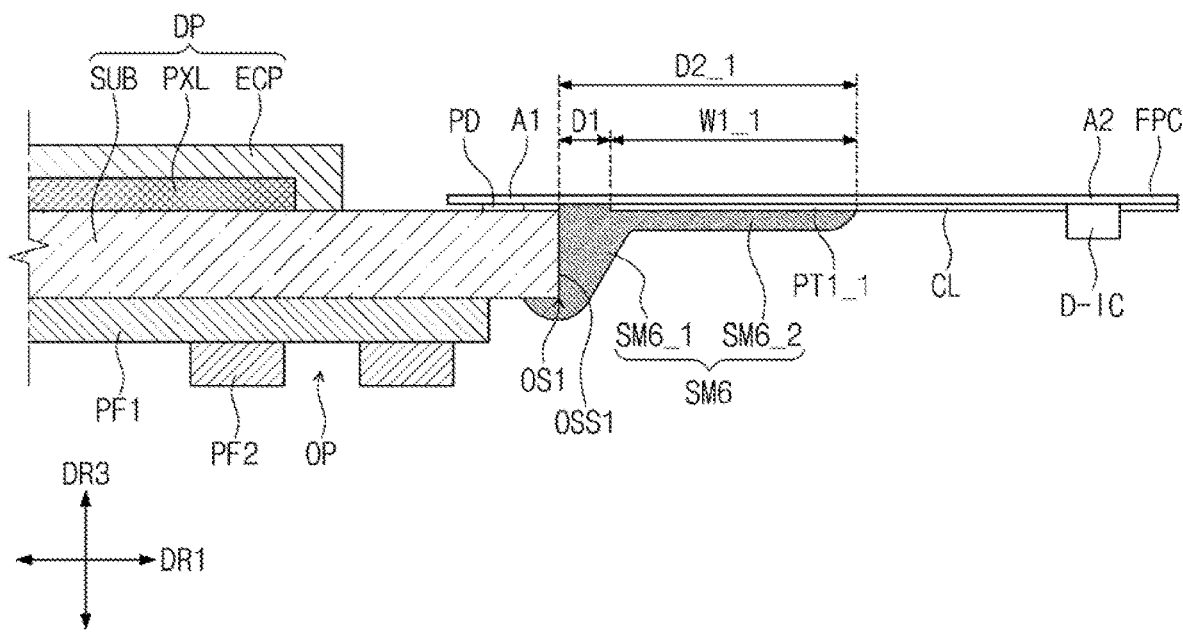
Figure 19:
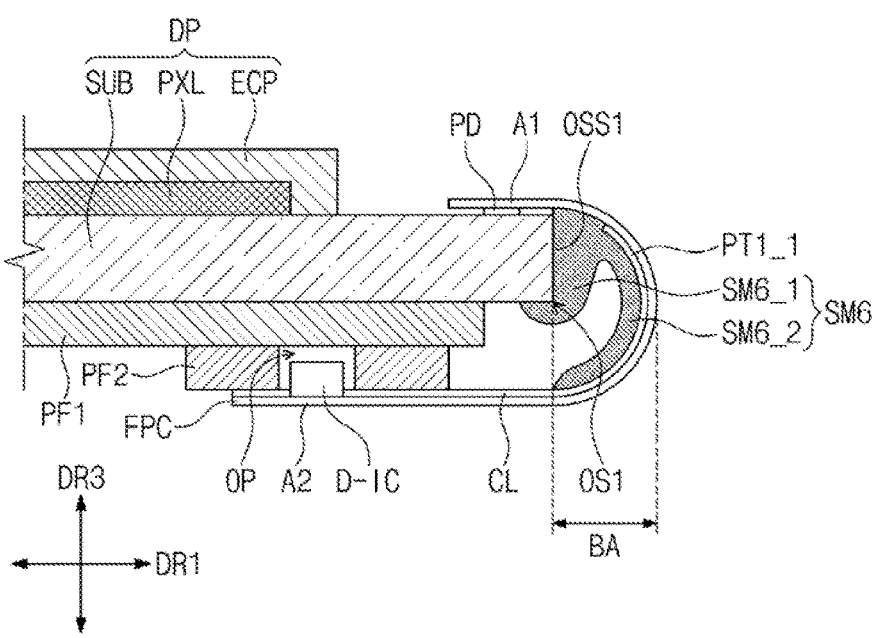

FIG. 18 is a schematic diagram illustrating a configuration of a reinforcing layer according to an exemplary embodiment of the present inventive concept. FIG. 19 is a schematic diagram illustrating a bending state of the flexible circuit board in FIG. 18.

Referring to FIGS. 18 and 19, a reinforcing layer SM6 may be disposed from a lower portion of a substrate SUB, which is adjacent to one side OS1 of the substrate SUB, to a first portion PT1 of a coating layer CL so as to be filled between the one side OS1 of the substrate SUB and the coating layer CL. As illustrated in FIG. 19, a first portion PT1_1 may be a portion of a coating layer CL, which overlaps a bending region BA.

The first portion PT1_1 may have a first width W1_1 greater than the first width W1 of the first portion PT1 in FIG. 5. Since the first width W1_1 is greater than the first width W1, a second distance D2_1 may be greater than the second distance D2 in FIG. 5.

The reinforcing layer SM6 may include a first protruding portion SM6_1 at least partially overlapping the lower portion of the substrate SUB, which is adjacent to the one side OS1 of the substrate SUB, and an area between the one side OS1 of the substrate SUB and the coating layer CL while protruding downward and a flat portion SM6_2, which overlaps a first portion PT1 and is flat. The flat portion SM6_2 disposed on the first portion PT1 may overlap the bending region BA. Although the reinforcing layer SM1 in FIG. 5 partially overlaps the bending region BA, the reinforcing layer SM6 may entirely overlap the bending region BA.

A resin having greater flowability may be used to form the flat portion SM6_2. Since the resin having the greater flowability may be provided on the first portion PT1, and the resin having the greater flowability may be spread after a predetermined time elapses, the flat portion SM6_2 may have a flat structure.

Figure 20:
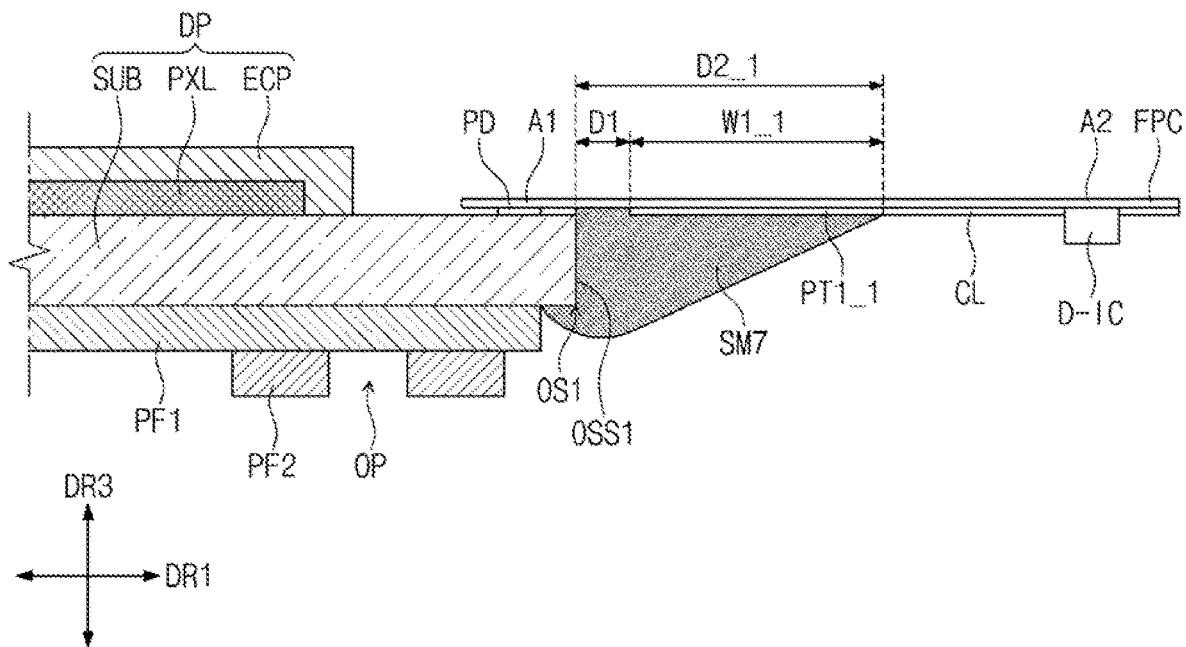

FIG. 20 is a schematic diagram illustrating a configuration of a reinforcing layer according to an exemplary embodiment of the present inventive concept. FIG. 21 is a schematic diagram illustrating a bending state of the flexible circuit board in FIG. 20.

Referring to FIGS. 20 and 21, a reinforcing layer SM7 may be disposed from a lower portion of a substrate SUB, which is adjacent to one side OS1 of the substrate SUB, to a first portion PT1_1 of a coating layer CL so as to be filled between one side OS1 of the substrate SUB and the coating layer CL. The first portion PT1_1 may be the same as the first portion PT1_1 in FIG. 18.

The reinforcing layer SM7 may have a protruding shape that protrudes downward. The reinforcing layer SM7 may entirely overlap a bending region BA like the reinforcing layer SM6 in FIGS. 18 and 19. The reinforcing layer SM7 may be formed by using a greater amount of resin than that used to form the reinforcing layer SM2 in FIG. 10.

FIG. 22 is a schematic diagram illustrating a configuration of a reinforcing layer according to an exemplary embodiment of the present inventive concept.

Referring to FIG. 22, a reinforcing layer SM8 may be disposed between one side OS1 of a substrate SUB and one side of a coating layer CL. Unlike the reinforcing layer SM1 in FIG. 5, the reinforcing layer SM8 might not be disposed on a lower portion of the coating layer CL.

The reinforcing layer SM8 may be disposed on a predetermined portion of one side surface OSS1 of the substrate SUB. For example, the reinforcing layer SM8 may be disposed on a predetermined portion of the one side surface OSS1, which is adjacent to an upper end of the one side surface OSS1 of the substrate SUB.

Although the thin-film encapsulation layer including the first, second, and third encapsulation layers EN1, EN2, and EN3 is illustrated as the encapsulation layer ECP in FIGS. 10 to 22, the present invention is not limited thereto. For example, the reinforcing layers SM2 to SM8 in FIGS. 10 to 22 may be applied to a display panel DP' including the encapsulation substrate EP and the sealing layer SL in FIGS. 8 and 9.

In the display device, according to exemplary embodiments of the present inventive concept, as the reinforcing layer is disposed on the lower portion of the flexible circuit board between the one side of the substrate and the coating layer, the bending part of the flexible circuit board may be supported.

It will be apparent to those skilled in the art that various modifications and variations can be made within the inventive concept. Thus, it is intended that the inventive concept covers all modifications and variations of the exemplary embodiments of the present invention that have been described herein.

What is claimed is:

1. A display device comprising:
   a substrate having a first side and a second side opposite to the first side;
   a plurality of pixels disposed on the substrate;
   a flexible circuit board connected to the first side of the substrate;
   a driving integrated circuit disposed on a lower portion of the flexible circuit board;
   a coating layer disposed on the lower portion of the flexible circuit board, the coating layer being spaced apart from the first side of the substrate and at least partially surrounding the driving integrated circuit; and
   a reinforcing layer extending from the first side of the substrate to the coating layer on the lower portion of the flexible circuit board and overlapping a portion of the coating layer such that the portion of the coating layer that is overlapped by the reinforcing layer is disposed between the reinforcing layer and the flexible circuit board, the reinforcing layer covering a side of the coating layer that faces the first side of the substrate,
   wherein the reinforcing layer contacts the first side of the substrate.

2. The display device of claim 1, wherein the reinforcing layer extends up to a first portion of the coating layer, which is adjacent to the side of the coating layer that faces the first side of the substrate, so as to be disposed on a lower portion of the first portion.

3. The display device of claim 2, wherein a first side of the first portion is the side of the coating layer that faces the first side of the substrate, and, with respect to a direction perpendicular to a top surface of the substrate, the reinforcing layer has a thickness that gradually decreases from the first side of the substrate to a second side of the first portion, the first and second sides of the first portion being opposite sides thereof.

4. The display device of claim 3, wherein a first width of the first portion, which is a distance between the first side of the first portion and the second side of the first portion, is greater than a first distance, which is a distance between the first side of the substrate and the side of the coating layer that faces the first side of the substrate.

5. The display device of claim 4, wherein the first distance is about 100 μm to about 200 μm.

6. The display device of claim 3, wherein a second distance between the first side of the substrate and the second side of the first portion is about 0.5 mm to about 1.5 mm.

7. The display device of claim 1, wherein the reinforcing layer has an elastic modulus that is less than that of the coating layer.

8. The display device of claim 7, wherein the reinforcing layer has an elastic modulus of about 50 MPa to about 500 MPa, and the coating layer has an elastic modulus of about 900 MPa.

9. The display device of claim 1, wherein the reinforcing layer comprises a UV-curing resin.

10. The display device of claim 1, further comprising a pad disposed on a predetermined portion of the substrate, which is adjacent to the first side of the substrate, and the pad being connected to the flexible circuit board, wherein the reinforcing layer is disposed between the first side of the substrate and the flexible circuit board so that a boundary of the reinforcing layer at least partially overlaps the first side of the substrate.

11. The display device of claim 1, further comprising:
a first protection film disposed on a lower portion of the substrate; and
a second protection film disposed on a lower portion of the first protection film.

12. The display device of claim 11, wherein the flexible circuit board is bent toward the lower portion of the substrate, and the driving integrated circuit is inserted into an opening portion defined in the second protection film.

13. The display device of claim 12, wherein the substrate has a rectangular shape having a pair of long sides extended primarily in a first direction and a pair of short sides extended primarily in a second direction, wherein the first side of the substrate is one of the pair of short sides.

14. The display device of claim 13, wherein a bending region, which is a portion in which the flexible circuit board is bent, has a width of about 0.3 mm to about 0.6 mm in the first direction.

15. The display device of claim 11, wherein a first side of the first protection film is disposed on a lower portion of a predetermined portion of the substrate, which is adjacent to the first side of the substrate, while being spaced apart from the first side of the substrate, and the second protection film is disposed on a lower portion of a predetermined portion of the first protection film, which is adjacent to the first protection film, while being spaced apart from the first protection film.

16. The display device of claim 15, wherein the reinforcing layer is further disposed on a lower portion of the substrate, which is adjacent to the first protection film, so as to at least partially cover a lower end of the substrate.

17. The display device of claim 16, wherein the reinforcing layer disposed on the lower portion of the substrate has a downwardly protruding shape.

18. The display device of claim 16, wherein the reinforcing layer is further disposed on a lower portion of the first protection film, which is adjacent to the second protection film, so as to cover a lower end of the first protection film.

19. The display device of claim 18, wherein the reinforcing layer disposed on the lower portion of the first protection film has a downwardly protruding shape.

20. The display device of claim 18, wherein, with respect to a direction perpendicular to a top surface of the substrate, the reinforcing layer disposed on the lower portion of the first protection film has a thickness that is less than a thickness of the second protection film.

21. The display device of claim 11, wherein the first side of the substrate, the first protection film, and the second protection film at least partially overlap each other.

22. The display device of claim 21, wherein the reinforcing layer is disposed on one side surface of the substrate, which is the first side of the substrate, and one side surface of the first protection film.

23. The display device of claim 21, wherein the reinforcing layer is disposed on one side surface of the substrate, which is the first side of the substrate, one side surface of the first protection film, and one side surface of the second protection film.

24. The display device of claim 1, further comprising:
an encapsulation substrate disposed on the substrate; and
a sealing layer disposed on the substrate and at least partially surrounding the plurality of pixels and coupling the substrate and the encapsulation substrate to each other.

25. The display device of claim 1, further comprising a thin-film encapsulation layer disposed on the substrate and covering the plurality of pixels.

26. A display device comprising:
a substrate;
a plurality of pixels disposed on the substrate;
a flexible circuit board connected to the substrate;
a driving integrated circuit disposed on the flexible circuit board;
a coating layer disposed on the flexible circuit board and being spaced apart from the substrate and at least partially surrounding the driving integrated circuit; and
a reinforcing layer disposed on the flexible circuit board, wherein the reinforcing layer extends from the substrate to a portion of the coating layer and overlaps the portion of the coating layer such that the portion of the coating layer that is overlapped by the reinforcing layer is disposed between the reinforcing layer and the flexible circuit board,
wherein the reinforcing layer contacts a first side of the substrate.

27. The display device of claim 26, wherein the reinforcing layer comprises:
a first protruding portion at least partially overlapping the substrate, and an area between the substrate and the coating layer while protruding downward; and
a second protruding portion at least partially overlapping the coating layer while protruding downward.

28. The display device of claim 26, wherein the reinforcing layer comprises:
a first protruding portion at least partially overlapping the substrate, and an area between the substrate and the coating layer while protruding downward; and
a flat portion, at least partially overlapping the coating layer.

29. The display device of claim 26, wherein, as the flexible circuit board is bent, the driving integrated circuit is disposed on the substrate, and the coating layer at least partially overlaps a bending region of the flexible circuit board.

30. The display device of claim 26, wherein the reinforcing layer has a downwardly protruding shape.

31. A display device comprising:
a substrate;
a plurality of pixels disposed on the substrate;
a flexible circuit board connected to the substrate;
a driving integrated circuit disposed on the flexible circuit board;
a coating layer disposed on the flexible circuit board while being spaced apart from the substrate and at least partially surrounding the driving integrated circuit; and
a reinforcing layer disposed on the flexible circuit board between the substrate and the coating layer,
wherein the reinforcing layer is disposed on a predetermined portion of the substrate, which is adjacent to an upper end of the substrate, and is not disposed on a lower portion of the coating layer, and
wherein the reinforcing layer contacts a first side of the substrate and a first side of the coating layer facing the first side of the substrate and does not overlap with the coating layer when viewed on a plane.

* * * * *